(12) United States Patent
Aratani et al.

(10) Patent No.: US 9,954,193 B2
(45) Date of Patent: Apr. 24, 2018

(54) MATERIAL FOR FORMING ORGANIC LIGHT-EMITTING LAYER, COATING LIQUID FOR FORMING ORGANIC LIGHT-EMITTING ELEMENT, ORGANIC LIGHT-EMITTING ELEMENT AND LIGHT SOURCE DEVICE, AND METHOD FOR MANUFACTURING SAME

(75) Inventors: Sukekazu Aratani, Tokyo (JP); Hirotaka Sakuma, Tokyo (JP); Shingo Ishihara, Tokyo (JP); Naoya Tokoo, Tokyo (JP); Hiroshi Sasaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 792 days.

(21) Appl. No.: 14/131,852

(22) PCT Filed: Jul. 11, 2012

(86) PCT No.: PCT/JP2012/067660
§ 371 (c)(1),
(2), (4) Date: Jan. 9, 2014

(87) PCT Pub. No.: WO2013/008835
PCT Pub. Date: Jan. 17, 2013

(65) Prior Publication Data
US 2014/0138663 A1    May 22, 2014

(30) Foreign Application Priority Data

Jul. 12, 2011 (JP) .................. 2011-153423
Jul. 19, 2011 (JP) .................. 2011-157408
Jul. 19, 2011 (JP) .................. 2011-157415

(51) Int. Cl.
*H01L 51/50* (2006.01)
*H01L 51/00* (2006.01)
(Continued)

(52) U.S. Cl.
CPC ...... *H01L 51/5024* (2013.01); *H01L 51/0085* (2013.01); *H01L 51/56* (2013.01);
(Continued)

(58) Field of Classification Search
CPC .................................................. H01L 51/5024
See application file for complete search history.

(56) References Cited

U.S. PATENT DOCUMENTS

2002/0121638 A1* 9/2002 Grushin ............... C07D 213/26
257/40
2004/0021425 A1* 2/2004 Foust ........................ G09F 9/33
315/169.3
(Continued)

FOREIGN PATENT DOCUMENTS

JP      09-063770       3/1997
JP      2005-068068 A   3/2005
(Continued)

OTHER PUBLICATIONS

Gschneidner et al. (Handbook on the Physics and Chemistry of Rare Earths, vol. 35, pp. 116,118).*
(Continued)

*Primary Examiner* — Francisco W Tschen
(74) *Attorney, Agent, or Firm* — Foley & Lardner LLP

(57) ABSTRACT

In an organic light-emitting element including a first electrode, a second electrode, and a light-emitting layer placed between the first electrode and the second electrode, the light-emitting layer includes a host material, a first emitter, and a second emitter, the emission peak wavelength of the first emitter is longer than the emission peak wavelength of the second emitter, and an aromatic heterocyclic ligand or an auxiliary ligand of the first emitter include an electron withdrawing group. Accordingly, an organic light-emitting element can be provided in which the HOMO value of a (Continued)

specific luminescent dopant is closer to the HOMO value of another luminescent dopant.

8 Claims, 4 Drawing Sheets

(51) Int. Cl.
  *H05B 33/10* (2006.01)
  *H05B 33/14* (2006.01)
  *H01L 51/56* (2006.01)
  *H01L 51/52* (2006.01)
  *H01L 27/32* (2006.01)

(52) U.S. Cl.
  CPC ............ *H05B 33/10* (2013.01); *H05B 33/14* (2013.01); *H01L 27/3204* (2013.01); *H01L 27/3211* (2013.01); *H01L 51/5004* (2013.01); *H01L 51/5036* (2013.01); *H01L 51/5203* (2013.01); *H01L 51/524* (2013.01); *H01L 2251/5361* (2013.01)

(56) References Cited

U.S. PATENT DOCUMENTS

| | | | |
|---|---|---|---|
| 2004/0155238 A1* | 8/2004 | Thompson | H01L 51/0087 257/40 |
| 2006/0125379 A1* | 6/2006 | Liu | H01L 51/5016 313/504 |
| 2006/0127698 A1* | 6/2006 | Tokailin | C07C 211/54 428/690 |
| 2008/0026576 A1* | 1/2008 | Shenai-Khatkhate et al. | |
| 2010/0141125 A1 | 6/2010 | Otsu et al. | |
| 2010/0244007 A1 | 9/2010 | Ono et al. | |
| 2011/0101316 A1* | 5/2011 | Lecloux | C09K 11/06 257/40 |
| 2011/0175066 A1* | 7/2011 | Sakuma | C09K 11/06 257/40 |
| 2012/0208999 A1 | 8/2012 | Konno | |
| 2013/0277622 A1 | 10/2013 | Aratani et al. | |
| 2013/0299788 A1 | 11/2013 | Sakuma et al. | |

FOREIGN PATENT DOCUMENTS

| | | |
|---|---|---|
| JP | 2006-290988 A | 10/2006 |
| JP | 2010-080979 A | 4/2010 |
| JP | 2010-177338 A | 8/2010 |
| JP | 2010-185068 A | 8/2010 |
| JP | 2010-202644 A | 9/2010 |
| JP | 2011-051919 A | 3/2011 |
| JP | 2011-151096 A | 8/2011 |
| JP | 2011-151097 A | 8/2011 |
| JP | 2012-502485 A | 1/2012 |
| JP | 2012-091005 A1 | 7/2012 |
| JP | 2012-142591 A | 7/2012 |
| JP | 2012-195601 A | 10/2012 |
| JP | 2013-145893 A | 7/2013 |
| WO | WO 2008/140115 A1 | 11/2008 |
| WO | WO 2009/057549 A1 | 5/2009 |
| WO | WO 2009/084413 A1 | 7/2009 |
| WO | WO 2010/028262 A1 | 3/2010 |
| WO | WO 2010/090362 A1 | 8/2010 |
| WO | WO 2011-024737 A1 | 3/2011 |

OTHER PUBLICATIONS

Japan Patent Office action on application 2011-157408 dated Mar. 4, 2014; pp. 1-2 (with partial English translation).
Office Action issued in Japanese Patent Application No. 2011-157415 dated Jul. 1, 2014 (with partial translation).
Japan Patent Office action on application 2011-157408 dated Sep. 10, 2014; pp. 1-2.
PCT International Search Report, PCT/JP2012/067660, dated Oct. 16, 2012, 5 pages.

* cited by examiner

FIG. 10

[Table 1]

| | Example 18 | Comparative Example 6 | Comparative Example 7 | Example 20 | Example 21 | Example 25 | Example 26 | Example 19 | Comparative Example 8 | Comparative Example 9 | Example 22 | Example 23 | Example 24 |
|---|---|---|---|---|---|---|---|---|---|---|---|---|---|
| Substrate 1 | Glass Substrate | Glass Substrate | Glass Substrate | Glass Substrate | Glass Substrate | Glass Substrate | Glass Substrate | Glass Substrate | Glass Substrate | Glass Substrate | Glass Substrate | Glass Substrate | Glass Substrate |
| Lower Electrode 2 | ITO | ITO | ITO | ITO | ITO | ITO | ITO | ITO | ITO | ITO | ITO | ITO | ITO |
| Positive Injecting Layer 3 | PEDOT:PSS | PEDOT:PSS | PEDOT:PSS | PEDOT:PSS | PEDOT:PSS | PEDOT:PSS | PEDOT:PSS | PEDOT:PSS | PEDOT:PSS | PEDOT:PSS | PEDOT:PSS | PEDOT:PSS | PEDOT:PSS |
| Hole Transporting Layer 4 | Triphenylamine Polymer | Triphenylamine Polymer | Triphenylamine Polymer | Triphenylamine Polymer | Triphenylamine Polymer | Triphenylamine Polymer | Triphenylamine Polymer | Chemical Formula (41) | Chemical Formula (41) | Chemical Formula (41) | Chemical Formula (41) | Chemical Formula (41) | Chemical Formula (41) |
| Light-Emitting Layer 5-1 Host 11-1 | BAlq | BAlq | BAlq | BAlq | BAlq | BAlq | BAlq | BAlq | BAlq | BAlq | BAlq | BAlq | BAlq |
| Dopant 12-1 | Chemical Formula (34) | Chemical Formula (34) | Chemical Formula (34) | Chemical Formula (34) | Chemical Formula (34) | Chemical Formula (34) | Chemical Formula (34) | Chemical Formula (34) | Chemical Formula (34) | Chemical Formula (34) | Chemical Formula (34) | Chemical Formula (34) | Chemical Formula (34) |
| Light-Emitting Layer 5-2 Host 11-2 | Chemical Formula (35) | Chemical Formula (35) | Chemical Formula (35) | Chemical Formula (35) | Chemical Formula (35) | Chemical Formula (35) | Chemical Formula (35) | Chemical Formula (35) | Chemical Formula (35) | Chemical Formula (35) | Chemical Formula (35) | Chemical Formula (35) | Chemical Formula (35) |
| Dopant 12-2 | Chemical Formula (36) | Chemical Formula (36) | Chemical Formula (36) | Chemical Formula (36) | Chemical Formula (36) | Chemical Formula (36) | Chemical Formula (36) | Chemical Formula (36) | Chemical Formula (36) | Chemical Formula (36) | Chemical Formula (36) | Chemical Formula (36) | Chemical Formula (36) |
| Light-Emitting Layer 5-3 Host 11-3 | Chemical Formula (37) | Chemical Formula (37) | Chemical Formula (37) | Chemical Formula (37) | Chemical Formula (37) | Chemical Formula (37) | Chemical Formula (37) | Chemical Formula (37) | Chemical Formula (37) | Chemical Formula (37) | Chemical Formula (37) | Chemical Formula (37) | Chemical Formula (37) |
| Dopant 12-3 | Chemical Formula (38) | Chemical Formula (40) | Chemical Formula (40) | Chemical Formula (43) | Chemical Formula (44) | Chemical Formula (49) | Chemical Formula (50) | Chemical Formula (42) | Chemical Formula (40) | Chemical Formula (40) | Chemical Formula (45) | Chemical Formula (46) | Chemical Formula (48) |
| Hole Blocking Layer 6-1 | BAlq | BAlq | BAlq | BAlq | BAlq | BAlq | BAlq | BAlq | BAlq | BAlq | BAlq | BAlq | BAlq |
| Hole Blocking Layer 6-2 | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer | N-arylbenzimidazoles Trimer |
| Hole Blocking Layer 6-3 | Chemical Formula (39) | Chemical Formula (39) | Chemical Formula (39) | Chemical Formula (39) | Chemical Formula (39) | Chemical Formula (39) | Chemical Formula (39) | N-arylbenzimidazoles Trimer | N-arylbenzimidazoles Trimer | Chemical Formula (39) | N-arylbenzimidazoles Trimer | N-arylbenzimidazoles Trimer | N-arylbenzimidazoles Trimer |
| Electron Transporting Layer 7 | Alq3 | Alq3 | Alq3 | Alq3 | Alq3 | Alq3 | Alq3 | Alq3 | Alq3 | Alq3 | Alq3 | Alq3 | Alq3 |
| Upper Electrode 9 | LiF/Al | LiF/Al | LiF/Al | LiF/Al | LiF/Al | LiF/Al | LiF/Al | LiF/Al | LiF/Al | LiF/Al | LiF/Al | LiF/Al | LiF/Al |
| Electron Blocking Layer 10 | No | No | TAPC | No | No | No | No | No | No | No | No | No | No |
| Current Efficiency of Blue Luminescence | | 0.6 of Example 18 | 1.0 of Example 18 | 0.9 of Example 18 | 1.0 of Example 18 | 0.9 of Example 18 | 0.9 of Example 18 | | 0.7 of Example 19 | 1.0 of Example 19 | 0.9 of Example 19 | 1.0 of Example 19 | 0.9 of Example 19 |

MATERIAL FOR FORMING ORGANIC LIGHT-EMITTING LAYER, COATING LIQUID FOR FORMING ORGANIC LIGHT-EMITTING ELEMENT, ORGANIC LIGHT-EMITTING ELEMENT AND LIGHT SOURCE DEVICE, AND METHOD FOR MANUFACTURING SAME

TECHNICAL FIELD

The present invention relates to a material for forming an organic light-emitting layer, a coating liquid for forming an organic light-emitting element, an organic light-emitting element, and a light source device.

BACKGROUND ART

Methods for manufacturing organic LEDs are classified broadly into the categories vacuum deposition methods and application methods. Among those methods, the application methods have advantages such as easy deposition for large areas and high material use efficiencies. In order to use the application methods, there is a need to reduce the numbers of layers in organic LEDs, and the light-emitting layers are required to have a single layer.

Conventionally, as an organic white light-emitting element including a single light-emitting layer, PLT 1 reports a single-layer type white light-emitting organic EL element with an inserted single light-emitting layer composed of a composition containing at least (a) a polymer and (b) luminescent center forming compounds, which is characterized in that the composition contains therein an electron transporting substance and a hole transporting substance in a balanced manner, the polymer itself produces a luminescent color of a blue or a shorter wavelength, two or more of the luminescent center forming compounds are dispersed as molecules in the polymer, the respective luminescent center forming compounds each independently produce luminescence, and two or more of the luminescent center forming compounds are used in combination so that as the luminescent color as a whole of the organic EL element appears as white light. Other documents include PLTs 2 to 4.

Methods for manufacturing organic LEDs are classified broadly into the categories vacuum deposition methods and application methods. Among those methods, the application methods have advantages such as easy deposition for large areas and high material use efficiencies. Methods for obtaining white light source devices by the application methods include: (1) a method of placing, on a plane surface, organic light-emitting elements that emit light respectively in blue, green, and red; (2) a method of stacking light-emitting layers that emit light respectively in blue, green, and red; and (3) a method of providing one light-emitting layer that emits light in respective colors of blue, green, and red.

PLT 5 discloses an organic light-emitting element that has a light-emitting layer containing a phosphorescent dopant material doped in an inactive host substance and a charge transporting dopant for doping, and can efficiently emit light in a blue region of a visible spectrum.

CITATION LIST

Patent Literature

PLT 1: Japanese Patent Application Laid-Open No. 9-63770
PLT 2: Japanese Patent Application Laid-Open No. 2010-185068
PLT 3: Japanese Patent Application Laid-Open No. 2006-290988
PLT 4: Japanese Patent Application Laid-Open No. 2005-68068
PLT 5: Japanese Patent Application Laid-Open No. 2010-80979

SUMMARY OF INVENTION

Technical Problem

Conventionally, when a host material is doped with two or more luminescent center forming compounds, the respective luminescent center forming compounds independently emit light, and two or more luminescent center forming compounds are thus used in combination so that the luminescent color as a whole is white light. However, in this method, the excitation energy will undergo energy transfer from a higher level to a lower level in each luminescent center forming compound.

In addition, conventional organic light-emitting elements have the problem of difficulty in dopant concentration control due to extremely low dopant concentrations. In addition, there has been a problem that, when an attempt is made to control the dopant concentrations, the luminescent efficiencies are decreased, thereby resulting in a failure to achieve high-efficiency light emissions.

Furthermore, conventional organic light-emitting elements have the problem of difficulty in dopant concentration control due to dopants and charge transporting layers without desired functional groups. In addition, conventional high-efficiency light-emitting elements have large numbers of layers stacked, and thus have the problem of costing a lot of time and money in the manufacturing process. This problem is particularly noticeable for blue.

An object of the present invention is to make the value of the HOMO (Highest Occupied Molecular Orbital) of a specific luminescent dopant closer to the value of the HOMO of another luminescent dopant. This causes the light-emitting layer to entirely emit light, and makes it easy to achieve white light emissions.

In addition, an object of the present invention is to provide an organic light-emitting material that can simply control the concentration of a dopant and achieves high-efficiency light emissions, a coating liquid for forming an organic light-emitting layer with the use of the organic light-emitting layer material, an organic light-emitting element with the use of the coating liquid for forming an organic light-emitting layer, and a light source device with the use of the organic light-emitting element, and manufacturing methods therefor.

Furthermore, an object of the present invention is to provide an organic light-emitting element and a light source device that have a smaller number of layers stacked and achieve high-efficiency light emissions.

Solution to Problem

Here are features of the present invention for solving the problems mentioned above.

(1) An organic light-emitting element including: a first electrode; a second electrode; and a light-emitting layer placed between the first electrode and the second electrode, where the light-emitting layer includes a host material, a first emitter, and a second emitter, the emission peak wavelength of the first emitter is longer than the emission peak wavelength of the second emitter, and an aromatic heterocyclic ligand or an auxiliary ligand of the first emitter contains an electron withdrawing group.

(2) The organic light-emitting element described above, where the auxiliary ligand of the first emitter is a picolinic acid derivative or a triazole derivative.

(3) The organic light-emitting element described above, where the electron withdrawing group is one or more functional groups selected from the group consisting of a trifluoromethyl group, a chloro group, a bromo group, an iodine group, an astato group, a phenyl group, a nitro group, and a cyano group.

(4) The organic light-emitting element described above, where a lower layer is placed between the first electrode or second electrode and the light-emitting layer, the lower layer is a hole transporting layer or a hole injecting layer, the light-emitting layer is placed between the lower layer and the second electrode or first electrode, and a substituent of the first emitter and a substituent of a material for forming the lower layer have any one or more of the following compositions.

(A) the substituent of the first emitter and the substituent of the material for forming the lower layer are alkyl groups having four or more carbon atoms.

(B) the substituent of the first emitter and the substituent of the material for forming the lower layer form a hydrogen bond.

(C) the substituent of the first emitter is a perfluorophenyl group, and the substituent of the material for forming the lower layer is a phenyl group.

(5) The organic light-emitting element described above, where the second emitter contains one or more functional groups selected from the group consisting of a fluoroalkyl group having three or more carbon atoms, a perfluoroalkyl group having three or more carbon atoms, a perfluoropolyether group, and an alkyl group having 10 or more carbon atoms, and a siloxy group.

(6) The organic light-emitting element described above, where the light-emitting layer contains a blue emitter, the first emitter is a red emitter, and the second emitter is a green emitter.

(7) An organic light-emitting element including: a first electrode; a second electrode; and a light-emitting layer placed between the first electrode and the second electrode, where the light-emitting layer includes a host material, a first emitter, and a second emitter, the emission peak wavelength of the first emitter is longer than the emission peak wavelength of the second emitter, and the difference is within 0.3 eV between the HOMO level of the first emitter and the HOMO level of the second emitter.

(8) The organic light-emitting element described above, where white light is emitted from the light-emitting layer.

(9) A material for forming an organic light-emitting layer, for use in the organic light-emitting element described above, where the material contains a host material, the first emitter, and the second emitter.

(10) A light source device including the organic light-emitting element described above.

(11) An organic light-emitting element including a first electrode, a second electrode, and a light-emitting layer placed between the first electrode and the second electrode, where the first electrode, the light-emitting layer, and the second electrode are placed in order on a surface of a substrate, the light-emitting layer contains a host and a first dopant, and the first dopant is represented by the following chemical formula (1).

[Chemical Formula 1]

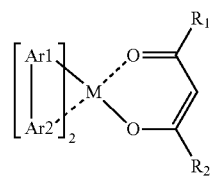

Chemical Formula (1)

In the formula, Ar1 and Ar2 represent an aromatic hydrocarbon or an aromatic heterocycle. M represents an element in the Group 8, 9 or 10 of the periodic table. $R_1$ represents an alkoxy group or an alkylthio group. $R_2$ represents any one functional group selected from the group consisting of a fluoroalkyl group having three or more carbon atoms, a perfluoroalkyl group having three or more carbon atoms, a perfluoropolyether group, an alkyl group having 10 or more carbon atoms, and a siloxy group. The respective substituents may form bonds with the other substituents.

(12) An organic light-emitting element including a first electrode, a second electrode, and a light-emitting layer placed between the first electrode and the second electrode, where the first electrode, the light-emitting layer, and the second electrode are placed in order on a surface of a substrate, the light-emitting layer contains a host and a first dopant, and the first dopant is represented by the following chemical formula (2)

[Chemical Formula 2]

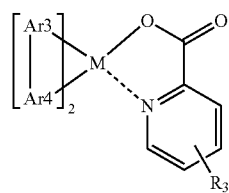

Chemical Formula (2)

In the formula, Ar3 and Ar4 represent an aromatic hydrocarbon or an aromatic heterocycle. M represents an element in the Group 8, 9 or 10 of the periodic table. $R_3$ represents any one functional group selected from the group consisting of a fluoroalkyl group having three or more carbon atoms, a perfluoroalkyl group having three or more carbon atoms, a perfluoropolyether group, and a siloxy group. The respective substituents may form bonds with the other substituents.

(13) An organic light-emitting element including a first electrode, a second electrode, and a light-emitting layer placed between the first electrode and the second electrode, where the first electrode, the light-emitting layer, and the second electrode are placed in order on a surface of a substrate, the light-emitting layer contains a host and a first dopant, and the first dopant is represented by the following chemical formula (3).

[Chemical Formula 3]

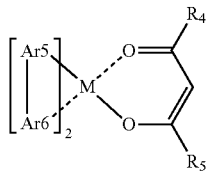

Chemical Formula (3)

In the formula, Ar5 and Ar6 represent an aromatic hydrocarbon or an aromatic heterocycle. M represents an element in the Group 8, 9 or 10 of the periodic table. $R_4$ represents —O—$(CH_2)_x$—$(Si(CH_3)_2$—$O)_y$—$SiR_{10}R_{11}R_{12}$ (x represents an integer of 0 or more; y represents an integer of 1 or more; and $R_{10}$, $R_{11}$, and $R_{12}$ represent an alkyl group). $R_5$ represents any one functional group selected from the group consisting of an alkyl group, a fluoroalkyl group having three or more carbon atoms, and a perfluoroalkyl group having three or more carbon atoms. The respective substituents may form bonds with the other substituents.

(14) An organic light-emitting element including a first electrode, a second electrode, and a light-emitting layer placed between the first electrode and the second electrode, where the first electrode, the light-emitting layer, and the second electrode are placed in order on a surface of a substrate, the light-emitting layer contains a host and a first dopant, and the first dopant is represented by the following chemical formula (4).

[Chemical Formula 4]

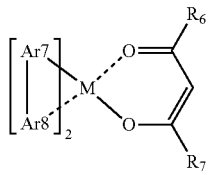

Chemical Formula (4)

In the formula, Ar7 and Ar8 represent an aromatic hydrocarbon, oxazole, thiazole, benzoxazole, or benzothiazole. M represents an element in the Group 8, 9 or 10 of the periodic table. $R_6$ represents any of an alkyl group, an alkoxy group, an alkylthio group, a fluoroalkyl group, or a perfluoroalkyl group. $R_7$ represents any one functional group selected from the group consisting of an alkyl group having ten or more carbon atoms, a fluoroalkyl group having three or more carbon atoms, a perfluoroalkyl group having three or more carbon atoms, a siloxy group, and a perfluoropolyether group. The respective substituents may form bonds with the other substituents.

(15) The organic light-emitting element described above, where the light-emitting layer contains any one or more selected from the group consisting of polycarbonate, polystyrene, acrylic resins, polyamide, and gelatin.

(16) The organic light-emitting element described above, where the first dopant has a concentration distribution in the light-emitting layer, and in a region of the light-emitting layer with the substrate farther therefrom, the molar concentration of the first dopant is higher than the average molar concentration of the first dopant in the light-emitting layer.

(17) The organic light-emitting element described above, where the light-emitting layer contains a second dopant, a wavelength at which the maximum intensity is shown in a photoluminescence spectrum for the second dopant is longer than a wavelength at which the maximum intensity is shown in a photoluminescence spectrum for the first dopant, and the molar concentration of the second dopant in the solid content is higher than the molar concentration of the first dopant in the solid content in the light-emitting layer.

(18) The organic light-emitting element described above, where the light-emitting layer contains a second dopant, the light-emitting layer is placed on a surface of a charge transporting layer containing a charge transporting material, the second dopant contains a substituent for the second dopant, the charge transporting material contains a substituent for the charge transporting material, and the second dopant is eccentrically located at the surface of the light-emitting layer with the charge transporting layer present thereon.

(19) The organic light-emitting element described above, where the substituent for the second dopant and the substituent for the charge transport ing material have any one or more of the following compositions.

(A) The substituent for the second dopant and the substituent for the charge transporting material are alkyl groups having four or more carbon atoms.

(B) The substituent for the second dopant and the substituent for the charge transporting material form a hydrogen bond.

(C) The substituent for the second dopant is a perfluorophenyl group, and the substituent for the charge transporting material is a phenyl group.

(20) A coating liquid for forming a light-emitting layer, for use in the organic light-emitting element described above, where the coating liquid contains a host, a first dopant, and a solvent.

(21) A material for forming a light-emitting layer, for use in the organic light-emitting element described above, where the material contains the host and the first dopant.

(22) A light source device including the organic light-emitting element, and a driving device for driving the organic light-emitting element.

(23) A method for manufacturing an organic light-emitting element including a first electrode, a second electrode, and a light-emitting layer placed between the first electrode and the second electrode, where the first electrode, the light-emitting layer, and the second electrode are formed in order on a surface of a substrate, the light-emitting layer is prepared by coating, the light-emitting layer contains a host and a first dopant, and the first dopant is represented by the following chemical formula (1).

[Chemical Formula 5]

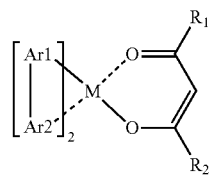

Chemical Formula (1)

In the formula, Ar1 and Ar2 represent an aromatic hydrocarbon or an aromatic heterocycle. M represents an element in the Group 8, 9 or 10 of the periodic table. $R_1$ represents an alkoxy group or an alkylthio group. $R_2$ represents any one functional group selected from the group consisting of a fluoroalkyl group having three or more carbon atoms, a perfluoroalkyl group having three or more carbon atoms, a perfluoropolyether group, an alkyl group having 10 or more carbon atoms, and a siloxy group. The respective substituents may form bonds with the other substituents.

(24) A light source device including a plurality of organic light-emitting elements placed on a surface of a substrate, where each organic light-emitting element has a lower electrode, an upper electrode, and a charge transporting layer and a light-emitting layer placed between the lower electrode and the upper electrode, the organic light-emitting elements have luminescent colors different from those of adjacent organic light-emitting elements, the light-emitting layer of at least one of the organic light-emitting elements contains a host and a first dopant, the first dopant has a first functional group, the concentration of the first dopant is higher in a region of the light-emitting layer with the upper electrode closer thereto than in a region thereof with the lower electrode closer thereto, or in a region of the light-emitting layer with the lower electrode closer thereto than in a region thereof with the upper electrode closer thereto.

Advantageous Effects of Invention

The present invention can provide an organic light-emitting element in which the value of the HOMO of a specific luminescent dopant is closer to the value of the HOMO of another specific dopant.

In addition, the present invention can provide an organic light-emitting material that can simply control the concentration of a dopant and achieves high-efficiency light emissions, a coating liquid for forming an organic light-emitting layer with the use of the organic light-emitting layer material, an organic light-emitting element with the use of the coating liquid for forming an organic light-emitting layer, and a light source device with the use of the organic light-emitting element, and manufacturing methods therefor.

Furthermore, the present invention can provide an organic light-emitting element and a light source device that have a smaller number of layers stacked and achieve high-efficiency light emissions.

BRIEF DESCRIPTION OF DRAWINGS

FIG. 10 illustrates Table 1 which describes the list of materials for use in respective layers according to Examples 18 to 26 and Comparative Examples 6 to 9 according to the present invention.

DESCRIPTION OF EMBODIMENTS

Embodiments of the present invention will be described below with the reference to the drawings and the like. The following description is intended to demonstrate specific examples according to the inventive subject matter of the present application, the invention of the present application is not to be considered limited to these descriptions, and various changes and modifications can be made by one skilled in the art within the scope of the technical idea disclosed in this specification. Throughout all of the drawings for illustrating the examples, parts which have the same functions are denoted by the same symbols, and the repeated descriptions thereof will be omitted.

Figure 1:
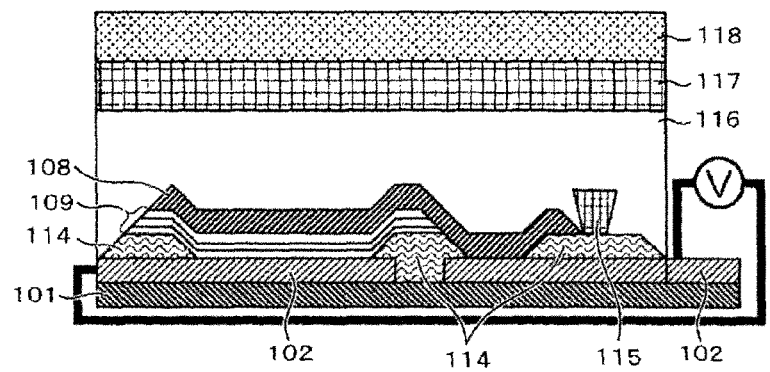
FIG. 1 is a cross-sectional view in an embodiment of a light source device according to the present invention.
Figure 2:
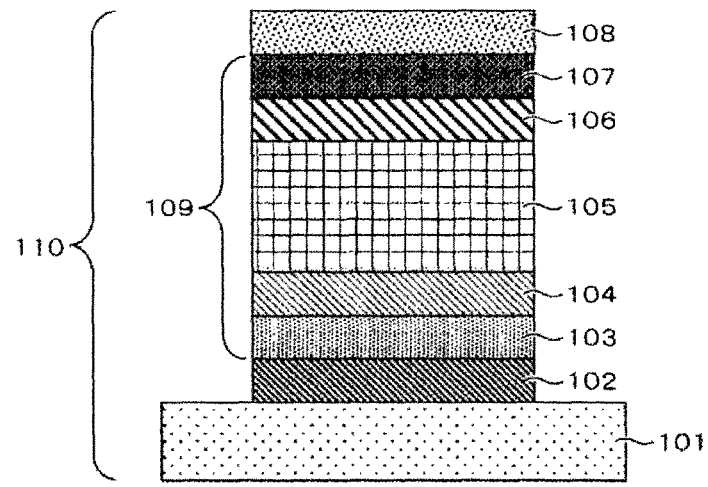
FIG. 2 is a cross-sectional view in an embodiment of an organic light-emitting element according to the present invention.

FIG. 1 is a cross-sectional view in an embodiment of a light source device according to the present invention. FIG. 2 is a cross-sectional view in an embodiment of an organic light-emitting element according to the present invention. In FIG. 1, a light-emitting section is composed of a substrate 101, a lower electrode 102, an upper electrode 108, an organic layer 109, a bank 114, an inverse tapered bank 115, a resin layer 116, a sealing substrate 117, and a light extraction layer 118. As the light-emitting section, there is no need for the light extraction layer 118.

The substrate 101 is a glass substrate. Besides the glass substrate, plastic substrates and metal substrates can be also used which are covered with an appropriate protective film for reducing water permeability.

The lower electrode 102 is formed on the substrate 101. The lower electrode 102 is an anode. A laminated body is used which has a transparent electrode such as an ITO and an IZO and a reflective electrode such as Ag. Besides the laminated body, combinations of Mo, Cr, or transparent electrodes with a light diffusion layer can be also used. In addition, the lower electrode 102 is not to be limited to an anode, and can be also used for a cathode. Used in that case is Al, Mo, a laminated body of Al and Li, an alloy such as AlNi, or the like. The lower electrode 102 is used through patterning on the substrate 101 by photolithography.

The upper electrode 108 is formed on the organic layer 109. The upper electrode 108 is a cathode. A laminated body is used which has a transparent electrode such as an ITO and IZO and an electron injecting electrode such as MgAg and Li. Besides the laminated body, a MgAg or Ag thin film can be even used by itself. In addition, in the formation of an ITO or an IZO by a sputtering method, a buffer layer may be provided between the upper electrode 108 and the organic layer 109 in some cases in order to reduce the damage caused by the sputtering. A metal oxide such as a molybdenum oxide and a vanadium oxide is used for the buffer layer. When the lower electrode 102 serves as a cathode as described above, the upper electrode 108 serves as an anode. In that case, a transparent electrode is used such as an ITO and IZO. The upper electrode 108 present in a specific light-emitting section is connected to the lower electrode 102 in a light-emitting section adjacent to the specific light-emitting section. This connection can provide a plurality of light-emitting section connected in series. By connecting a driving device to the plurality of light-emitting section connected in series, a light source device is formed.

The organic layer 109 is formed on the lower electrode 102. The organic layer 109 may have a multi-layer structure of a light-emitting layer and a lower layer, or a multi-layer structure including any one or more layers of an electron injecting layer, an electron transporting layer, a hole transporting layer, and a hole injecting layer.

The bank 114 is formed to cover ends of the lower electrode 102, and thereby prevent partial short-circuit failure in the light-emitting section. As the material of the bank 114, photosensitive polyimide is preferred. However, the material is not to be considered limited to the photosensitive polyimide, and acrylic resins and the like can be also used. In addition, non-photosensitive materials can be also used.

The inverse tapered bank 115 is used for, with the inverse tapered shape, keeping the upper electrode 108 in an adjacent light-emitting section from conduction. It is preferable to use a negative photoresist as the inverse tapered bank 115. The inverse tapered bank 115 can be also formed from various types of polymers, or various types polymers stacked, besides the negative photoresist.

The resin layer 116 is formed on the upper electrode 108. The resin layer 116 is used for sealing the light-emitting section. Various types of polymers can be used, such as epoxy resins. In order to improve the sealing performance, an inorganic passivation film can be also used between the upper electrode 108 and the resin layer 116.

The sealing substrate 117 is formed on the resin layer 116. The sealing substrate 117 is a glass substrate. As the sealing substrate 117, besides the glass substrate, plastic substrates can be also used which have an appropriate gas barrier film.

The light extraction layer 118 is formed on the sealing substrate 117. The light extraction layer 118 is used to efficiently extract light emitted in the light-emitting layer in the organic layer 13. As the light extraction layer 118, a film is used which has a scattering property and a diffuse reflective property.

Conventional methods have problems such as difficulty in controlling the amount of a doping emitter, a failure to obtain desired chromaticity, and low luminescent efficiency. The cause therefor consists in the energy transfer between emitters. The excitation energy of the emitter is lower in the order of blue emitters, green emitters, and red emitters. Therefore, energy is likely to be transferred from the blue emitters with shorter emission peak wavelengths as compared with the green emitters and the red emitters, to the green emitters, and from the green emitters with shorter emission peak wavelengths as compared with the red emitters, to the red emitters.

When a structure is employed in which one light-emitting layer 105 has three colors of emitters, the three colors of emitters are present close to each other. Therefore, energy is more likely to be transferred. In such a condition that facilitates energy transfer, energy is more likely to be transferred to the red emitter with the lowest excitation energy, and blue light emissions will be thus decreased, thereby failing to achieve desired chromaticity. In addition, light emissions from the green emitter with high luminescent efficiency are also decreased, thus failing to high-efficiency white light emissions. In order to adequately produce blue light emissions, there has been a need to significantly reduce the amount of the green emitter and the amount of the red emitter. Therefore, it becomes difficult to control the amount of the doping emitter. When the emitters for doping the light-emitting layer 105 are the blue emitter and the green emitter, the blue emitter and the red emitter, or the red emitter and the green emitter, the same problem will be also caused.

<Light-Emitting Layer>

The light-emitting layer 105 formed by a wet method or the like, includes a host material and emitters including substituents for localization during the deposition of the light-emitting layer 105. The light-emitting layer 105 according to an example of the present invention includes a host material and two or more types of emitters, and the emission peak wavelength of the first emitter is longer than the emission peak wavelength of the second emitter.

The emitters are localized near the surface of the light-emitting layer 105 or the interface between the light-emitting layer 105 and the lower layer in the preparation of the light-emitting layer 105. The lower layer refers to a layer that serves as a base for the light-emitting layer 105 in the preparation of the light-emitting layer 105. The emitter with a substituent for localization at the interface between the light-emitting layer 105 and the lower layer in the preparation of the light-emitting layer 105 is referred to as a first emitter, whereas the emitter with a substituent for localization on the surface of the light-emitting layer 105 in the preparation of the light-emitting layer 105 is referred to as a second emitter. In the first emitter, the substituent for localization in the lower layer in the preparation of the light-emitting layer 105 is not indispensable. In the second emitter, the substituent for localization on the surface of the light-emitting layer 105 in the preparation of the light-emitting layer 105 is not indispensable. The localization near the surface of the light-emitting layer 105 in the preparation of the light-emitting layer 105 means that the concentration in the layer is higher near the surface of the specified light-emitting layer 105.

When the light-emitting layer 105 includes, for example, three types of emitters for red, blue, and green, and when the first emitter and the second emitter contain the substituents described above, the light-emitting layer 105 formed by a wet method has substantially the same function as a light-emitting layer 105 of three layers stacked. This structure makes the distances between the emitters of different luminescent colors larger except for near the interfaces. More specifically, energy is less likely to be transferred between the emitters. Therefore, it becomes easy to control the amounts of the doping emitters. Therefore, when white light is emitted from the light-emitting layer 105, an organic light-emitting element for white can be easily formed.

A Spin coat method, a cast method, a dip coat method, a spray coat method, a screen printing method, an ink-jet printing method, and the like can be used as an application method for depositing the light-emitting layer 105.

<First Emitter>

Examples of the first emitter for use in an embodiment of the present invention include compounds represented by the following general formula (1).

[Chemical Formula 6]

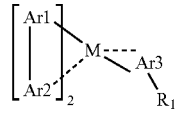

General Formula (1)

In the formula, Ar1 and Ar2 represent an aromatic hydrocarbon or an aromatic heterocycle. Ar3 represents a picolinic acid derivative, acetylacetonate, or a triazole derivative. M represents an element in the Group 8, 9 or 10 of the periodic table. $R_1$ represents one or more trifluoromethyl groups, a chloro group, a bromo group, an iodine group, an astato group, a phenyl group, a nitro group, and a cyano group, and the respective substituents may form bonds with the other substituents.

The auxiliary ligand of the first emitter includes an electron withdrawing group. The auxiliary ligand refers to a ligand which makes no main contribution to luminescence. The auxiliary ligand of the first emitter is Ar3.

Examples of the aromatic heterocycles include a quinoline ring, an isoquinoline, a pyridine ring, a quinoxaline ring, a thiazole ring, a pyrimidine ring, a benzothiazole ring, an oxazole ring, a benzoxazole ring, an indole ring, an isoindole ring, a thiophene ring, a benzothiophene ring.

Examples of the aromatic hydrocarbon include a benzene ring, a naphthalene ring, an anthracene ring, a furan ring, a benzofuran ring, a fluorene ring.

Examples of the electron withdrawing group include one or more of a trifluoromethyl group, a chloro group, a bromo group, an iodine group, an astato group, a phenyl group, a nitro group, and a cyano group. Each electron withdrawing group may be bonded to the other electron withdrawing group.

When the emission peak wavelength of the first emitter is longer than the emission peak wavelength of the second emitter, the HOMO level of the first emitter is typically shallow than the HOMO level of the second emitter. When the auxiliary ligand of the first emitter includes the electron withdrawing group, the HOMO level of the first emitter is closer to the HOMO level of the second emitter, as compared with a case of an auxiliary ligand containing no electron withdrawing group. This increases the hole mobility for propagating the light-emitting layer region including the first emitter.

In addition, holes are efficiently propagated from the light-emitting layer region including the first emitter to the light-emitting layer region including the second emitter to cause the light-emitting layer to entirely emit light, thus improving the chromaticity and improving the efficiency. The difference between the HOMO level of the first emitter and the HOMO level of the second emitter desirably falls within 0.3 eV, particularly within 0.2 eV, and further within 0.1 eV. When the first emitter includes a cyano group or a nitro group, the HOMO level of the first emitter is closer to the HOMO level of the second emitter such as the blue emitter as compared with other substituents, and the first emitter is thus less likely to become a trap.

Even in methods other than the case of the electron withdrawing group included in the auxiliary ligand of the first emitter, as long as the difference falls within 0.3 eV between the HOMO level of the first emitter and the HOMO level of the second emitter, the hole mobility for propagating the light-emitting layer region including the first emitter is increased to improve the chromaticity and improve the luminescent efficiency. The methods other than the case of the electron withdrawing group included in the auxiliary ligand of the first emitter include a method of introducing an electron withdrawing group in a heterocyclic ligand when the first emitter contains therein the heterocyclic ligand for making a contribution to luminescence.

The use of the interaction between the first emitter and the material for forming the lower layer may localize the first emitter at the surface of the light-emitting layer 105 with the lower layer present thereon. When alkyl group each having, for example, four or more carbon atoms are provided for the substituent provided for the first emitter and the functional group provided for the material for forming the lower layer, the interaction between the alkyl chains localizes the first emitter near the lower layer. In this case, the substituent of the first emitter and the substituent of the material for forming the lower layer attract the first emitter in the light-emitting layer 105 to the surface of the light-emitting layer 105 with the lower layer present thereon. Therefore, a single application can form a pseudo stacked structure.

In this case, the first emitter forms a concentration distribution in the light-emitting layer 105, where the peak position of the first emitter concentration is closer to the lower layer from the center of the light-emitting layer 105 in the film thickness direction of the light-emitting layer 105. In addition, the concentration of the first emitter monotonically decreases from the peak position of the first emitter concentration toward the surface of the light-emitting layer 105 without the lower layer in the film thickness direction of the light-emitting layer 105. In the case of using the interaction between the first emitter and the material for forming the lower layer, a hydroxy group or a carboxyl group may be used as the substituent of the first emitter and the functional group of the material for forming the lower layer.

In addition, substituents that can form a hydrogen bond are provided for the substituent of the first emitter and the substituent of the material for forming the lower layer to strengthen the interaction between the first emitter and the material for forming the lower layer, and localize the first emitter near the lower layer. The conceivable substituents which can form a hydrogen bond include, but not limited to, the following compositions. The substituents which can form a hydrogen bond may be at least one of the following compositions, or may exist two or more thereof. It is desirable to select only one of the following compositions as the substituents which can form a hydrogen bond. This can inhibit hydrogen bonds between the first dopants.

(1) the substituent of the first emitter is a hydroxy group, whereas the substituent of the material for forming the lower layer is a carboxyl group (2) the substituent of the first emitter is a carboxyl group, whereas the substituent of the material for forming the lower layer is a hydroxy group (3) the substituent of the first emitter is an amide group, whereas the substituent of the material for forming the lower layer is an acyl group (4) the substituent of the first emitter is an acyl group, whereas the substituent of the material for forming the lower layer is an amide group (5) the substituent of the first emitter is an amino group, whereas the substituent of the material for forming the lower layer is a hydroxy group Examples of the acyl group include a carboxyl group, alkanoyl groups such as an acetyl group, a benzoyl group, a sulfonyl group, and a phosphonoyl group. The functional groups mentioned above may be directly provided on the main skeleton of the dopant or the material for forming the lower layer, or may be provided with an amide linkage or an ester linkage interposed.

In addition, the perfluorophenyl group for the substituent of the first emitter and the phenyl group for the substituent of the material for forming the lower layer form a strong intermolecular attractive force comparable to a hydrogen bond. To summarize the foregoing, the following compositions are conceivable as the substituent of the first emitter and the substituent of the material for forming the lower layer. In this case, at least one of the following compositions may be present, or two or more thereof may be present.

(1) The substituent of the first emitter and the substituent of the material for forming the lower layer are alkyl groups having four or more carbon atoms.

(2) The substituent of the first emitter and the substituent of the material for forming the lower layer form a hydrogen bond.

(3) The substituent of the first emitter is a perfluorophenyl group, and the substituent of the material for forming the lower layer is a phenyl group.

The first emitter included in the light-emitting layer 105 may be entirely provided with the substituent, or the first emitter may be partially provided with the substituent. In addition, the material for forming the lower layer may be entirely provided with the substituent, or the material may be partially provided with the substituent.

<Second Emitter>

The provision of a specific substituent for the second emitter makes the peak position of the second emitter concentration closer to the surface for deposition from the center of the light-emitting layer 105 in the film thickness direction of the light-emitting layer 105. In addition, the concentration of the second emitter monotonically decreases from the peak position of the second emitter concentration toward the lower layer in the film thickness direction of the light-emitting layer 105.

Examples of the second emitter for use in an embodiment of the present invention include compounds represented by the following general formula (2).

[Chemical Formula 7]

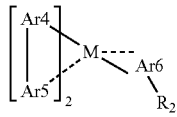

General Formula (2)

In the formula, Ar4 and Ar5 represent the above-mentioned aromatic hydrocarbon or the above-mentioned aromatic heterocycle. M represents an element in the Group 8, 9 or 10 of the periodic table. Ar6 represents a picolinic acid derivative, acetylacetonate, or a triazole derivative. $R_2$ represents a fluoroalkyl group having three or more carbon atoms, a perfluoroalkyl group having three or more carbon atoms, a perfluoropolyether group, an alkyl group having 10 or more carbon atoms, or a siloxy group, and the respective substituents may form bonds with the other substituents.

Examples of the substituent for the movement to the surface of the light-emitting layer 105 during the formation of the light-emitting layer 105 includes, for example, a fluoroalkyl group, a perfluoroalkyl group, an alkyl group (the number of C is 10 or more), a perfluoropolyether group, and a siloxy group (—Si—O—Si—). In consideration of surface energy, a fluoroalkyl group and a perfluoropolyether group are desirable, and a perfluoroalkyl group is further desirable. The second emitter only has to have one of these substituents, but may have more than one type of the substituents.

Substituents including fluorine are eccentrically located closer to the surface of the light-emitting layer 105 during the deposition as the number of fluorine atoms is increased. Specifically, the number of fluorine atoms present in the substituent is desirably 7 or more. The groups may be directly introduced into the main skeleton, or may be introduced with an amide linkage, an ester linkage, or the like interposed.

When the emitter for doping the light-emitting layer 105 has the red emitter, the blue emitter, and the green emitter, the red emitter and the green emitter desirably serve as the first emitter and the second emitter, respectively, in consideration of energy transfer between the emitters.

<Host Material>

As the host material of the light-emitting layer 105, for example, mCP (1,3-bis(carbazole-9-yl)benzene) can be used. Other carbazole derivatives, fluorene derivatives, arylsilane derivatives, and the like can be also used as the host material. In order to achieve efficient light emissions, the excitation energy of the host material is preferably adequately higher than the excitation energy of the blue emitter. It is to be noted that the excitation energy is measured with the use of the emission spectrum.

Alternatively, the host material may be a mixture of several types of host materials. The host material may be partially substituted with a fluoroalkyl group, a perfluoroalkyl group, an alkyl group (the number of C is 10 or more), a perfluoropolyether group, or a siloxy group (—Si—O—Si—). Due to such a host material mixed, the host material is likely to be partially localized on the surface of the light-emitting layer 105 during the deposition, and co-exists with the second emitter on the light-emitting surface. Thus, the second emitter is less likely to aggregate on the surface, thereby allowing higher-efficiency light emissions. In consideration of surface energy, a fluoroalkyl group and a perfluoropolyether group are desirable, and a perfluoroalkyl group is further desirable. The host material only has to have one of these substituents, but may have more than one type of the substituents. Substituents including fluorine are eccentrically located closer to the surface of the light-emitting layer 105 during the deposition as the number of fluorine atoms is increased. Specifically, the number of fluorine atoms present in the substituent is desirably 7 or more. These substituents may be directly introduced into the main skeleton, or may be introduced with an amide linkage, an ester linkage, or the like interposed.

<Hole Injecting Layer>

Examples of the hole injecting layer 103 include PEDOT (poly(3,4-ethylenedioxythiophene)):PSS (polystyrene sulfonate), polyaniline-series, polypyrrole-series, and triphenylamine-series polymer materials, and materials containing metal microparticles. In addition, phthalocyanine compounds can be also applied which often used in combination with low molecular materials.

<Hole Transporting Layer>

Various types of polymers of polyfluorene-series polymers, arylamine series, polyparaphenylene series, polyarylene series, and polycarbazole series can be used as the hole transporting layer 104. In addition, starburst amine compounds, stilbene derivatives, hydrazone derivatives, thiophene derivatives, and the like can be used. In addition, polymers may be used which contain the materials mentioned above. In addition, the hole transporting layer 104 is not to be considered limited to these materials, and there is no harm in using two or more of these materials in combination.

<Electron Transporting Layer>

The electron transporting layer 106 is a layer for supplying electrons to the light-emitting layer 105. As the electron transporting layer 106, a laminated structure of bis(2-methyl-8-quinolinolato)-4-(phenylphenolato) aluminum (hereinafter, BAlq) and tris(8-quinolinolato) aluminum (hereinafter, Alq3) can be used, and single films can be used such as Balq, Alq3, oxadiazole derivatives, triazole derivatives, fullerene derivatives, phenanthroline derivatives, quinoline derivatives, and triarylborane derivatives.

In addition, the electron transporting layer 106 may have a laminated structure of a blocking material that has the function of blocking holes and excited states and an electron transporting material. BAlq, phenanthroline derivatives, triazole derivatives, triarylborane derivatives, and the like can be used as the blocking material. Alq3, oxadiazole derivatives, fullerene derivatives, quinoline derivatives, silole derivatives, and the like can be used as the electron transporting material.

<Electron Injecting Layer>

The electron injecting layer 107 is used for improving the electron injection efficiency from the cathode into the electron transporting layer 106. Examples of the electron injecting layer 107 include lithium fluoride, magnesium fluoride, calcium fluoride, strontium fluoride, barium fluoride, magnesium oxide, and calcium oxide. In addition, mixtures may be used which have an electron transporting material with an alkali metal or an alkali metal oxide. In addition, mixtures may be used which have an electron transporting material with an electron donating material. Obviously, the electron injecting layer 107 is not to be limited to these materials, and there is no harm in using two or more of these materials in combination.

<Coating Liquid for Light-Emitting Layer>

The coating liquid for the light-emitting layer is obtained by dissolving, in an appropriate solvent, the host material, the first emitter and second emitter of different luminescent colors. The solvent may be tetrahydrofuran (THF), aromatic hydrocarbon solvents such as toluene, ether solvents such as tetrahydrofuran, alcohols, fluorine solvents, as long as the respective materials are dissolved in the solvent. In addition, mixed solvents may be adopted which have more than one of the previously mentioned solvents mixed for the adjustment of the solubility and drying rate for each material. The solubility of the solvent is measured by a liquid chromatogram method.

Example 1

In the present example, the organic light-emitting element in FIG. 2 was prepared. In FIG. 2, the OLED 110 has the lower electrode 102 as the first electrode, the upper electrode 108 as the second electrode, and the organic layer 109. The OLED 110 in FIG. 2 is structured such that the lower electrode 102, the organic layer 109, and the upper electrode 108 are placed in this order, which is a bottom-emission type for extracting light emitted by the light-emitting layer 105 from the lower electrode 102 side. In this case, the lower electrode 102 is a transparent electrode to serve as an anode, whereas the upper electrode 108 is a reflective electrode to serve as a cathode. The organic light-emitting element is not limited to the bottom-emission element structure, a top-emission element structure with the upper electrode as a transparent electrode may be adopted as long as the upper electrode serves as a cathode, whereas the lower electrode serves as an anode.

The organic layer 109 has a hole injecting layer 103, a hole transporting layer 104, a light-emitting layer 105, an electron transporting layer 106, and an electron injecting layer 107. The stacked structure of the organic layer 109 is not necessarily required as mentioned above, and a single-layer structure may be adopted which has only the light-emitting layer 105. Alternatively, a stacked structure without the hole transporting layer 104 may be adopted for the organic layer 109, or a stacked structure of an electron transporting layer and a blocking layer may be adopted for the electron transporting layer 106.

The light-emitting layer 105 has host molecules and emitters. The emitter includes a red emitter, a blue emitter, and a green emitter. The material for forming the light-emitting layer 105 contains the host molecules, the red emitter, the blue emitter, and the green emitter. Alternatively, the material for forming the light-emitting layer 105 may contain the host molecules, the red emitter, and the blue emitter. In the light-emitting layer 105, a pseudo stacked structure is formed in such a manner that the red emitter is eccentrically located on the hole transporting layer 104 side, whereas the green emitter is eccentrically located on the electron transporting layer 106 side. First, the composition of the light-emitting layer 105 will be described The iridium compound represented by the following chemical formula (5) was used as a material for the red emitter.

[Chemical Formula 8]

Chemical Formula (5)

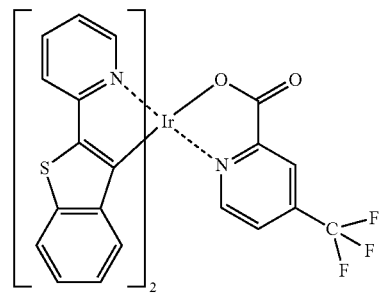

The auxiliary ligand of the chemical formula (5) contains a picolinic acid and a trifluoromethyl group as an electron withdrawing group, and the chemical formula (5) has a HOMO level of 4.9 eV. The value of the HOMO level was calculated with the use of a density function method. The red emitter 112 contains the picolinic acid and the electron withdrawing group, thereby reducing the HOMO level, and thus, the use of the emitter improves the hole mobility in a region of the light-emitting layer containing the red emitter 112, thereby causing the entire light-emitting layer 105 to emit light.

On the other hand, FIrpic represented by the following chemical formula (6) was used as the blue emitter.

[Chemical Formula 9]

Chemical Formula (6)

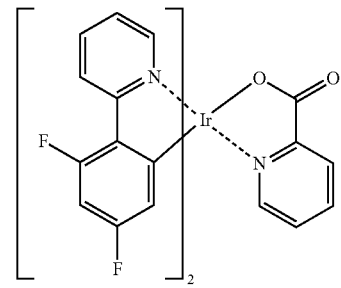

The FIrpic has a HOMO level of 5.2 eV. Although there is no need to use any special functional group for the blue emitter 113, the blue emitter 113 may have a substituent poorly compatible with the hole transporting layer, hole injecting layer, or lower electrode to serve as the lower layer.

The iridium complex represented by the following chemical formula (7) was used as a material for the green emitter.

[Chemical Formula 10]

Chemical Formula (7)

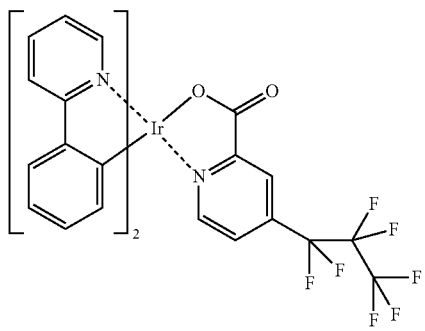

PEDOT (poly(3,4-ethylenedioxythiophene)):PSS (polystyrene sulfonate) was used as the hole injecting layer 103. A polyfluorene polymer was used as the hole transporting layer 104. A laminated structure of bis(2-methyl-8-quinolinolato)-4-(phenylphenolato) aluminum (hereinafter, BAlq) and tris(8-quinolinolato)aluminum (hereinafter, Alq3) was used as the electron transporting layer 106. Lithium fluoride was used for the electron injecting layer 107.

An ITO was used as the lower electrode 102. Al was used as the upper electrode 108.

As for the coating liquid for the light-emitting layer, the host material, the red emitter, the blue emitter, and the green emitter were each adjusted for 100:1:5:1 in terms of ratio by weight in the present example. Tetrahydrofuran (THF) was used for the solvent.

An organic film was formed by, in the present example, a spin coating method as an application method for depositing the light-emitting layer 105.

When + potential and − potential were applied respectively to the lower electrode and upper electrode of the light-emitting element according to the present example, a white light emission was obtained which was composed of three colors of red, blue, and green.

When a light-emitting element was prepared in the same way as in Example 1 except that the following chemical formula (8) was used as the red emitter, only a strong red light emission was obtained with weak blue and green light emissions. This is believed be because, due to the red emitter of the following chemical formula (8) with a HOMO level of 4.6 eV, the red emitter functions to strongly trap holes in the light-emitting layer region containing the red emitter to extremely decrease the mobility, thereby making it difficult to propagate holes to the light-emitting region containing the blue emitter.

[Chemical Formula 11]

Chemical Formula (8)

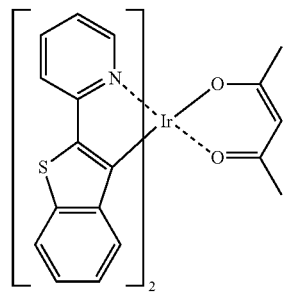

Example 2

A light-emitting element was prepared in the same way as in Example 1, except that the following chemical formula (9) was used as the red emitter in the material constituting the light-emitting layer 105.

[Chemical Formula 12]

Chemical Formula (9)

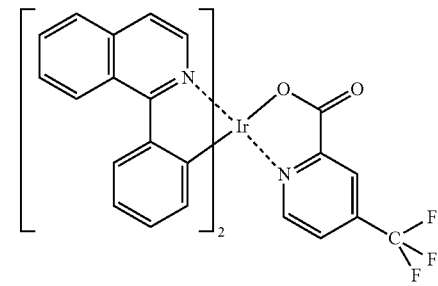

As a result of using the material represented by the chemical formula (7), a white light emission was obtained which was composed of three colors of red, blue, and green. The compound of the chemical formula (7) has a HOMO level of 4.9 eV, and there is a small energy difference of 0.3 eV from the HOMO level of the blue dopant.

Example 3

A light-emitting element was prepared in the same way as in Example 1, except that the following chemical formula (10) was used as the red emitter in the material constituting the light-emitting layer 105.

[Chemical Formula 13]

Chemical Formula (10)

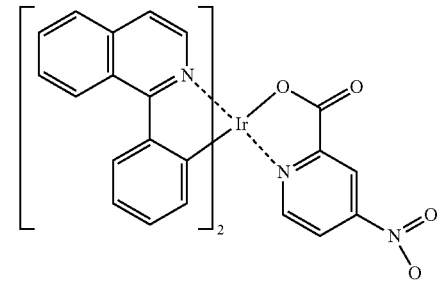

As a result of using the material represented by the chemical formula (10), a white light emission was obtained which was composed of three colors of red, blue, and green. The compound of the chemical formula (10) has a HOMO level of 5.1 eV, and there is a small energy difference of 0.1 eV from the HOMO level of the blue dopant.

Example 4

A light-emitting element was prepared in the same way as in Example 1, except that the hole transporting layer 104 containing a hydroxy group was used as a layer under the light-emitting layer 105, and a compound (the following chemical formula (11)) substituted with an aldehyde group in place of the nitro group of the chemical formula (10) was used as the red emitter of the light-emitting layer 105. As a result, a white light emission was obtained which was composed of three colors of red, blue, and green.

[Chemical Formula 14]

Chemical Formula (11)

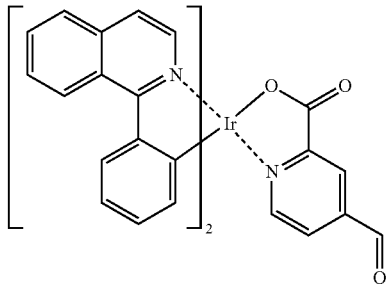

The compound of the chemical formula (11) has a HOMO level of 5.0 eV, and there is a small energy difference of 0.2 eV from the HOMO level of the blue dopant.

Example 5

A light-emitting element was prepared in the same way as in Example 1, except that a compound (the following chemical formula (12)) substituted with a chloro group in place of the nitro group of the chemical formula (10) was used as the red emitter of the light-emitting layer 105. As a result, white light emissions were obtained which were each composed of three colors of red, blue, and green.

[Chemical Formula 15]

Chemical Formula (12)

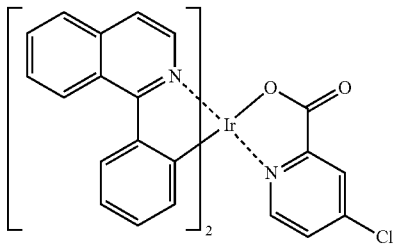

The compound of the chemical formula (12) has a HOMO level of 4.9 eV, and there is a small energy difference of 0.3 eV from the HOMO level of the blue dopant.

Example 6

A light-emitting element was prepared in the same way as in Example 1, except that a compound (the following chemical formula (13)) substituted with an iodine group in place of the nitro group of the chemical formula (10) was used as the red emitter of the light-emitting layer 105. As a result, white light emissions were obtained which were each composed of three colors of red, blue, and green.

[Chemical Formula 16]

Chemical Formula (13)

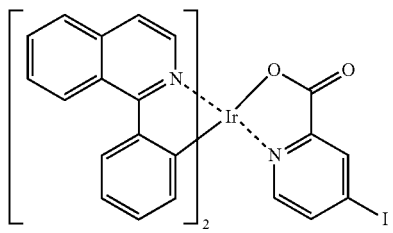

The compound of the chemical formula (13) has a HOMO level of 4.9 eV, and there is a small energy difference of 0.3 eV from the HOMO level of the blue dopant.

The organic light-emitting elements prepared by the conventional application method have a green dopant concentration of 0.02 mol %, and red dopant concentrations of 0.02 mol % and 0.015 mol %, which are extremely low in order to inhibit energy transfer from the blue dopant, thus making it difficult to control the concentrations of the dopants. In addition, no adequate luminescent efficiency has been achieved because of energy transfer between the respective dopants, carriers insufficiently confined in the light-emitting region and the like.

Figure 3:
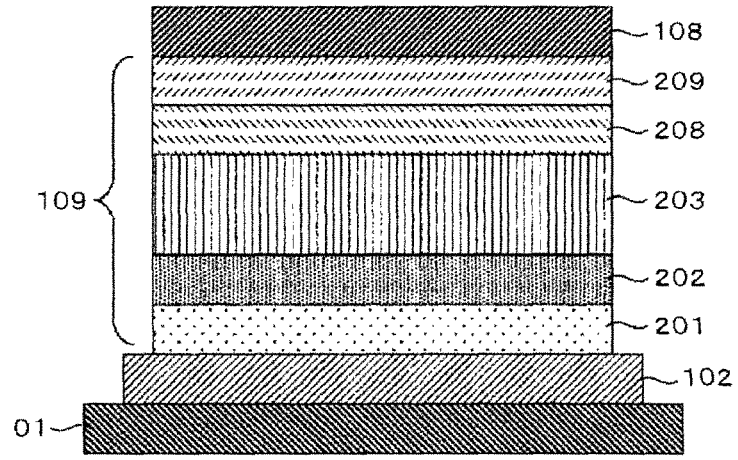
FIG. 3 is a cross-sectional view in an embodiment of the organic light-emitting element according to the present invention.

FIG. 3 is a cross-sectional view of an organic light-emitting element according to an embodiment of the present invention. This organic light-emitting element has an upper electrode 108, a lower electrode 102, and an organic layer 109. The upper electrode 108 and the lower electrode 102 correspond to any one of the first electrode and the second electrode. From the lower side of FIG. 3, a substrate 101, the lower electrode 102, the organic layer 109, and the upper electrode 108 are placed in this order, and the organic white light-emitting element in FIG. 3 is a bottom-emission type for extracting light emitted by the light-emitting layer 3 from the lower electrode 102 side. The lower electrode 102 is a transparent electrode to serve as an anode, whereas the upper electrode 108 is a reflective electrode to serve as a cathode. It is to be noted that a top-emission element structure may be adopted which has the upper electrode 108 as a transparent electrode, as long as the upper electrode is a cathode whereas the lower electrode 102 is an anode. The substrate 101 and the lower electrode 102, the lower electrode 102 and the organic layer 109, or the organic layer 109 and the upper electrode 108 may be brought into contact with each other, and an inorganic buffer layer, an injecting layer, or the like may be interposed between the respective layers. Examples of the inorganic buffer layer include a vanadium oxide, a molybdenum oxide, and a tungsten oxide.

The organic layer 109 may have a single-layer structure of only the light-emitting layer 203, or a multi-layer structure including any one or more of the electron injecting layer 209, the electron transporting layer 208, the hole transporting layer 202, and the hole injecting layer 201. The electron injecting layer 209 and the electron transporting layer 208, the electron transporting layer 208 and the light-emitting layer 203, the light-emitting layer 203 and the hole transporting layer 202, or the hole transporting layer 202 and the hole injecting layer 201 may be brought into contact with each other, and an inorganic buffer layer, an injecting layer, or the like may be interposed between the respective layers.

The light-emitting layer 203 contains a host and a dopant. The light-emitting layer 203 is a layer in which luminescence is produced by recombination of electrons and holes injected from the upper electrode 108, the lower electrode 102, the electron transporting layer 208 or the hole transporting layer 202. The light-emitting section may be in the light-emitting layer 203, or at the interface between the light-emitting layer 203 and the layer adjacent to the light-emitting layer 203.

Fluorescent compounds and phosphorescent compounds can be used as the dopant. The dopant contains any one or more of a red dopant, a green dopant, and a blue dopant. The material for forming the light-emitting layer 203 is composed of a host, a red dopant, a green dopant, and a blue dopant. When white light is emitted from the light-emitting layer 203, the material for forming the light-emitting layer 203 may contain: a host, a red dopant, and a blue dopant; a host, a red dopant, and a green dopant; or a host, a green dopant, and a blue dopant. When light other than white light is emitted from the light-emitting layer 203, the material for forming the light-emitting layer 203 may contain, for example, a host and a monochromatic dopant.

The red dopant, green dopant, and blue dopant have different luminescent colors. The "different luminescent colors" refers to different wavelengths at which the maximum intensity is shown in PL spectra for each dopant. The PL spectrum herein is an abbreviation of "photoluminescence spectrum".

The light-emitting layer 203 may contain a binder polymer. Examples of the binder polymer include any one of polycarbonate, polystyrene, an acrylic resin, polyamide, and gelatin. The binder polymer contained can increase the viscosity of the light-emitting layer 203, and improve the printing performance. In addition, the film stability of the light-emitting layer 203 can be improved.

<Host>

The host refers to a material used for immobilizing the dopant which forms an excited state by an electric field and then emit light, and the host generally has a wider difference (band gap) between HOMO and LUMO than that of the dopant. It is preferable to use, as the host, a carbazole derivative, a fluorene derivative, an arylsilane derivative, or the like. In order to achieve efficient light emissions, the excitation energy of the host is preferably adequately higher than the excitation energy of the blue dopant. It is to be noted that the excitation energy is measured with the use of the emission spectrum.

<Dopant Related to Surface Energy>

In the present invention, a material with a substituent capable of reducing the surface energy, such as a fluoroalkyl group having 3 or more carbon atoms, is used for the dopant, and the dopant forms a concentration distribution in the light-emitting layer 203, and the concentration can be increased in an upper portion of the light-emitting layer 203. Hereinafter, the material including a substituent capable of reducing the surface energy is referred to as a surface dopant. In that case, in the light-emitting layer 203, a region in which the molar concentration of the surface dopant is higher than the average molar concentration (the molar concentration calculated from the amounts of the materials mixed when the coating liquid for the light-emitting layer is prepared) is formed on the side opposite to the substrate in the formation of the light-emitting layer 203. Such a region formed can achieve white light emissions without making a fine adjustment of the dopant concentration. $R_2$, $R_3$, $R_4$, and $R_7$ in the chemical formula (1) to (4) mentioned above correspond to substituents capable of reducing the surface energy.

The surface of a substance is unstable with high energy without any gravitational effect, because there are generally no molecules of the same species on one side, unlike the inside of the substance. Therefore, in order to reduce the surface energy, a deforming force (surface tension) is applied so as to reduce the surface area. In addition, when the substance has therein a molecule including a functional group with low surface energy, the surface energy is reduced for stabilization by exposing the functional group on the surface.

For example, in the case of water and a surfactant (amphiphilic molecules), the surfactant has, in the molecules thereof, a hydrophobic group as a functional group with low surface energy, and reduces the surface energy of the water surface by forming a monomolecular film on the water surface in such a manner that the hydrophobic group comes out from the water surface.

The surface dopant in the present invention has, in molecules thereof, a functional group with low surface energy, such as a fluoroalkyl group. The moiety such as a benzene ring in the dopant is higher in surface energy than the functional group with low surface energy.

When the light-emitting layer 203 is formed, a force is applied so as to make the functional group with low surface energy onto the surface, in order to reduce the surface energy. This action will move molecules including the functional group with low surface energy onto the film surface, form a concentration distribution of the surface dopant, and form a pseudo phase separation of the light-emitting layer 203.

The surface dopant included in the light-emitting layer 203 may be entirely provided with the substituent, or the dopant may be partially provided with the substituent.

When the light-emitting layer 203 contains therein any two or more dopants of a red dopant, a green dopant, and a blue dopant, only one single dopant of the two or more dopants may be provided with the substituent, or more than one of the two or more dopants may be provided with the substituent.

When such a substituent is introduced for the auxiliary ligand in the surface dopant of a metal complex, the LUMO (Lowest Unoccupied Molecular Orbital) of the auxiliary ligand such as acetylacetonate (acac) is decreased unlike luminescent auxiliary ligand such as picolinate (pic), and likely to cause mixing with the LUMO of the heterocyclic ligand. The mixing causes the originally non-luminescent auxiliary ligand to contribute to luminescence. When the non-luminescent auxiliary ligand such as acetylacetonate comes to contribute to luminescence, the fluorescence yield will be decreased, and the luminescent efficiency will be decreased. Therefore, high-efficiency light emissions can be achieved by keeping the non-luminescent auxiliary ligand from making almost no contribution to luminescence. Specifically, the high-efficiency light emissions are achieved by a method such as the introduction of a specific substituent for the auxiliary ligand. $R_1$, $R_4$, and $R_6$ in the chemical formulas (1), (3), and (4) mentioned above correspond to the above-mentioned specific substituent.

The surface dopants for use in an embodiment of the present invention include compounds represented by the following chemical formula (1) to (4).

[Chemical Formula 17]

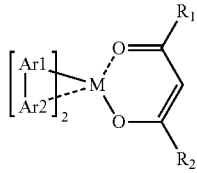

Chemical Formula (1)

In the chemical formula (1), Ar1 and Ar2 represent an aromatic hydrocarbon or an aromatic heterocycle. Ar1 and Ar2 may be identical. M represents an element in the Group 8, 9 or 10 of the periodic table. $R_1$ represents an alkoxy group or an alkylthio group. $R_2$ represents any of a fluoroalkyl group having three or more carbon atoms, a perfluoroalkyl group having three or more carbon atoms, a perfluoropolyether group, an alkyl group having 10 or more carbon atoms, or a siloxy group, and the respective substituents may form bonds with the other substituents. As the number of fluorine atoms is increased, the surface dopant is more likely to be localized near the surface of the light-emitting layer 203.

[Chemical Formula 18]

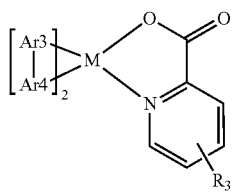

Chemical Formula (2)

In the chemical formula (2), Ar3 and Ar4 represent an aromatic hydrocarbon or an aromatic heterocycle. M represents an element in the Group 8, 9 or 10 of the periodic table. $R_3$ represents any of a fluoroalkyl group having three or more carbon atoms, a perfluoroalkyl group having three or more carbon atoms, a perfluoropolyether group, an alkyl group having 10 or more carbon atoms, or a siloxy group.

[Chemical Formula 19]

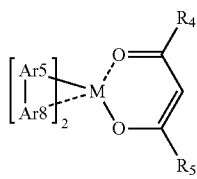

Chemical Formula (3)

In the chemical formula (3), Ar5 and Ar6 represent an aromatic hydrocarbon or an aromatic heterocycle. Ar5 and Ar6 may be identical. M represents an element in the Group 8, 9 or 10 of the periodic table. $R_4$ represents —O—$(CH_2)_x$—$(Si(CH_3)_2$—O$)_y$—$SiR_{10}R_{11}R_{12}$ (x represents an integer of 0 or more; y represents an integer of 1 or more; and $R_{10}$, $R_{11}$, and $R_{12}$ represent an alkyl group). $R_5$ represents any of an alkyl group, a fluoroalkyl group having three or more carbon atoms, or a perfluoroalkyl group having three or more carbon atoms, and the respective substituents may form bonds with the other substituents.

In the case of the chemical formula (3), $R_4$ serves as a substituent capable of reducing the surface energy, and the effect of the present application is thus produced even when the number of carbon atoms is smaller than 10 in the case of an alkyl group for $R_5$.

[Chemical Formula 20]

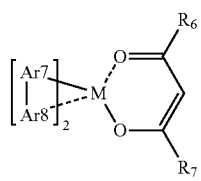

Chemical Formula (4)

In the chemical formula (4), Ar7 and Ar8 represent an aromatic hydrocarbon, oxazole, thiazole, benzoxazole, or benzothiazole. M represents an element in the Group 8, 9 or 10 of the periodic table. $R_7$ represents an alkyl group, an alkoxy group, an alkylthio group, a fluoroalkyl group, or a perfluoroalkyl group. $R_8$ represents an alkyl group having ten or more carbon atoms, a fluoroalkyl group having three or more carbon atoms, a perfluoroalkyl group having three or more carbon atoms, a siloxy group, or a perfluoropolyether group, and the respective substituents may form bonds with the other substituents.

When the heterocyclic ligand is used for Ar7 or Ar8 of the chemical formula (4), a dopant is obtained which produces luminescence to some extent even when the acetylacetonate is not provided with an alkoxy group.

Examples of the aromatic hydrocarbon include benzene, naphthalene, anthracene, phenanthrene, perylene, tetracene, pyrene, benzpyrene, chrysene, triphenylene, and fluoranthene. The aromatic hydrocarbons mentioned above may have substituents.

Examples of the aromatic heterocycle include furan, benzofuran, thiophene, benzothiophene, pyrrole, pyrazole, imidazole, oxydiazole, indole, carbazole, pyrrolo-imidazole, pyrrolo-pyrazole, pyrrolo-pyrrole, thienopyrrole, thienothiophene, furopyrrole, furofuran, thienofuran, benzoisoxazole, benzoisothiazole, benzoimidazole, pyridine, pyradine, pyridazine, pyrimidine, triazine, quinoline, isoquinoline, shinorine, quinoxaline, benzimidazole, perimidine, and quinazoline. The aromatic heterocycles mentioned above may have substituents.

Examples of the alkyl group include a methyl group, an ethyl group, a propyl group, 1-methylethyl group, a butyl group, 1-methylpropyl group, 2-methylpropyl group, 1,1-dimethylethyl group, a pentyl group, 1-methylbutyl group, 2-methylbutyl group, 3-methylbutyl group, 1,1-dimethylpropyl group, 1,2-dimethylpropyl group, 2,2-dimethylpropyl group, 1-ethylpropyl group, 2-ethylpropyl group, a hexyl group, and a cyclohexyl group.

Examples of the alkoxy group include a methoxy group, an ethoxy group, a propoxy group, 1-methyl ethoxy group, a butoxy group, 1-methylpropoxy group, 2-methylpropoxy group, 1,1-dimethylethoxy group, a pentyloxy group, 1-methylbutoxy group, 2-methylbutoxy group, 3-methylbutoxy group, 1,1-dimethyl propoxy group, 1,2-dimethyl propoxy group, 2,2-dimethyl propoxy group, and 1-ethyl propoxy group.

Examples of the alkylthio group include a methylthio group, an ethylthio group, a propylthio group, 1-methylethylthio group, a butylthio group, 1-methylpropylthio group, 3-methylpropylthio group, 1,1-dimethylethylthio group, a pentylthio group, 1-methylbutylthio group, 2-methylbutylthio group, 3-methylbutylthio group, 1,1-dimethylbutylthio group, 1,2-dimethylbutylthio group, and 2,2-dimethylbutylthio group.

<Dopant Related to Interaction with Charge Transporting Material>

The dopant other than the dopant with the substituent capable of reducing the surface energy and the charge transporting material are provided with appropriate substituents to use the interaction between the dopant and the charge transporting material, thereby localizing the dopant at the surface of the light-emitting layer 203 with the charge transporting layer present thereon. The charge transporting layer refers to the hole transporting layer 202 or the electron transporting layer 208 in FIG. 3. The dopant using the interaction with the charge transporting material is referred to as a base dopant. When the base dopant and the charge transporting material are each provided with an alkyl group having four or more carbon atoms, the interaction between alkyl chains localizes the base dopant near the charge transport layer. In this case, the substituent of the dopant and the substituent of the charge transporting material attract the base dopant in the light-emitting layer 203 toward the surface of the light-emitting layer 203 with the charge transporting layer present thereon. Therefore, a single application can form pseudo stacked layers. In this case, attention is paid so as not to use any alkyl group for $R_2$, $R_3$, and $R_5$ in the surface dopant of the chemical formulas (1), (2), and (3). That attention can maintain the function of localization on the surface of the light-emitting layer 203.

In this case, the base dopant forms a concentration distribution in the light-emitting layer 203, where the peak position of the base dopant concentration is closer to the charge transporting layer from the center of the light-emitting layer 203 in the film thickness direction of the light-emitting layer 203. In addition, the concentration of the base dopant monotonically decreases from the peak position of the base dopant concentration toward the surface of the light-emitting layer 203 without the charge transporting layer in the film thickness direction of the light-emitting layer 203. In the case of using the interaction between the base dopant and the charge transporting material, a hydroxy group or a carboxyl group may be used as the substituent of the base dopant and the substituent of the charge transporting material.

In addition, substituents that can form a hydrogen bond are provided for the substituent of the base dopant and the substituent of the charge transporting material to strengthen the interaction between the base dopant and the charge transporting material, and localize the base dopant near the charge transporting layer. The conceivable substituents which can form a hydrogen bond include, but not limited to, the following compositions. The substituents which can form a hydrogen bond may be at least one of the following compositions, or may exist two or more thereof. It is desirable to select only one of the following compositions as the substituents which can form a hydrogen bond. This can inhibit hydrogen bonds between the dopants.

(1) the substituent of the base dopant is a hydroxy group, whereas the substituent of the charge transporting material is a carboxyl group (2) the substituent of the base dopant is a carboxyl group, whereas the substituent of the charge transporting material is a hydroxy group (3) the substituent of the base dopant is an amide group, whereas the substituent of the charge transporting material is an acyl group (4) the substituent of the base dopant is an acyl group, whereas the substituent of the charge transporting material is an amide group (5) the substituent of the base dopant is an amino group, whereas the substituent of the charge transporting material is a hydroxy group Examples of the acyl group include a carboxyl group, alkanoyl groups such as an acetyl group, a benzoyl group, a sulfonyl group, and a phosphonoyl group. The substituents mentioned above may be directly provided on the main skeleton of the base dopant or the charge transporting layer, or may be provided with an amide linkage or an ester linkage interposed.

In addition, the perfluorophenyl group for the substituent of the base dopant and the phenyl group for the substituent of the charge transporting material form a strong intermolecular attractive force comparable to a hydrogen bond. To summarize the foregoing, the following compositions are conceivable as the functional group of the dopant and the substituent of the charge transporting layer. In this case, at least one of the following compositions may be present, or two or more thereof may be present.

(1) The substituent of the base dopant and the substituent of the charge transporting material are alkyl groups having four or more carbon atoms.

(2) The substituent of the base dopant and the substituent of the charge transporting material form a hydrogen bond.

(3) The substituent of the base dopant is a perfluorophenyl group, and the substituent of the charge transporting material is a phenyl group.

The base dopant contained in the light-emitting layer 203 may be entirely provided with the functional group, or the base dopant may be partially provided with the functional group. In addition, the charge transporting material contained in the charge transporting layer may be entirely provided with the functional group, or the charge transporting material may be partially provided with the functional group.

When the light-emitting layer 203 contains therein any two or more dopants of a red dopant, a green dopant, and a blue dopant, only one single dopant of the two or more dopants may be provided with the substituent, or more than one of the two or more dopants may be provided with the substituent.

<Blue Dopant>

The blue dopant has the maximum intensity of a PL spectrum at room temperature between 400 nm and 500 nm. An Ir complex is used for the blue dopant. In addition, various types of metal complexes of Pd, Pt, Al, and the like, and organic materials such as styrylamine series and triazine derivatives can be also used.

When the light-emitting layer 203 has therein the blue dopant and the dopant (green dopant or red dopant) which exhibits the maximum intensity in a PL spectrum at a longer wavelength than the blue dopant, and when the green dopant or the red dopant is a surface dopant, the energy transfer is inhibited from the blue dopant to the green dopant or red dopant with low excitation energy, and the molar concentration of the blue dopant in the solid content of the light-emitting layer 203 can be thus made higher than the molar concentration of the green dopant or red dopant in the solid content of the light-emitting layer 203.

<Green Dopant>

The green dopant has the maximum intensity of a PL spectrum at room temperature between 500 nm and 590 nm. An Ir complex is used for the green dopant. In addition, various types of metal complexes of Pd, Pt, Al, and the like, and organic materials such as coumarin dyes, quinacridone, and triazine derivatives can be also used.

When the light-emitting layer 203 has therein the green dopant and the dopant (red dopant) which exhibits the maximum intensity in a PL spectrum at a longer wavelength than that of the green dopant, and when the red dopant is a surface dopant, the energy transfer is inhibited from the green dopant to the red dopant with low excitation energy, and the molar concentration of the green dopant in the solid content of the light-emitting layer 203 can be thus made higher than the molar concentration of the red dopant in the solid content of the light-emitting layer 203.

<Red Dopant>

The red dopant has the maximum intensity of a PL spectrum at room temperature between 590 nm and 780 nm. An Ir complex is used for the red dopant. In addition, various types of metal complexes of Pd, Pt, Al, Zn, and the like, and organic materials such as DCM ([2-[(E)-4-(dimethylamino)styryl]-6-methyl-4H-pyran-4-ylidene]malononitrile), and triazine derivatives can be also used.

<Hole Injecting Layer>

The hole injecting layer 201 is used for the purpose of improving the luminescent efficiency or lifetime. In addition, although not particularly essential, the layer is used for the purpose of reducing the asperity of the anode. The hole injecting layer 201 may be provided as a single layer or multiple layers. As the hole injecting layer 201, conductive polymers are preferred such as PEDOT (poly(3,4-ethylenedioxythiophene)):PSS (polystyrene sulfonate) are preferred. Besides, polymer materials of polypyrrole and triphenylamine series can be used. Furthermore, it is also possible to apply phthalocyanine compounds and starburst amine compounds which are often used in combination with low molecular (weight average molecular weight: 10000 or less) materials.

<Hole Transporting Layer>

The hole transporting layer 202 is used for transporting holes injected from the anode, to the light-emitting layer. As the hole transporting layer 202, fluorene, carbazole, arylamine, or the like is used by itself, or a copolymer thereof is used. Materials that have thiophene series or pyrrole series in their skeletons can be even used as copolymers. In addition, polymers can be also used which have, for their side chains, a skeleton such as fluorene, carbazole, arylamine, thiophene, and pyrrole. In addition, the layer is not to be considered limited to the polymers, and starburst amine compounds, arylamine compounds, stilbene derivatives, hydrazone derivatives, thiophene derivatives, and the like, can be also used. In addition, polymers may be used which contain the materials mentioned above. In addition, the hole transporting layer 202 is not to be considered limited to these materials, and there is no harm in using two or more of these materials in combination.

<Electron Transporting Layer>

The electron transporting layer 208 is a layer for supplying electrons to the light-emitting layer 203. In a broad sense, the electron injecting layer 9 and the hole blocking layer are also included in the electron transporting layer 208.

The electron transporting layer 208 may be provided as a single layer or multiple layers. For example, bis(2-methyl-8-quinolinolato)-4-(phenylphenolato) aluminum (hereinafter, BAlq), tris(8-quinolinolato) aluminum (hereinafter, Alq3), Tris(2,4,6-trimethyl-3-(pyridin-3-yl)phenyl)borane (hereinafter, 3TPYMB), 1,4-Bis(triphenylsilyl)benzene (hereinafter, UGH2), oxadiazole derivatives, triazole derivatives, fullerene derivatives, phenanthroline derivatives, quinoline derivatives and the like can be used as a material for the electron transporting layer 208.

<Electron Injecting Layer>

The electron injecting layer 209 improves the electron injection efficiency from the cathode into the electron transporting layer 208. Specifically, lithium fluoride, magnesium fluoride, calcium fluoride, strontium fluoride, barium fluoride, magnesium oxide, and aluminum oxide are desirable. Obviously, the electron injecting layer 209 is not to be limited to these materials, and there is no harm in using two or more of these materials in combination.

<Substrate>

Examples of the substrate 101 include glass substrates, metal substrates, and plastic substrates with inorganic materials such as $SiO_2$, $SiNx$, and $Al_2O_3$ formed. The metal substrate materials include alloys such as stainless steel and 42 alloy. The plastic substrate materials include polyethylene terephthalate, polyethylene naphthalate, polymethylmethacrylate, polysulfone, polycarbonate, and polyimide.

<Anode>

As the anode material, any material can be used as long as the material has a high work function. Specifically, the materials include conductive oxides such as ITO and IZO, and metals which are high in work function, such as thin Ag. The electrode pattern can be typically formed by using photolithography or the like on a substrate such as glass.

<Cathode>

The cathode material is an electrode for injecting electrons into the light-emitting layer 203. Specifically, a laminated body of LiF and Al, a Mg:Ag alloy and the like are preferably used. In addition, the cathode is not to be considered limited to these materials, and for example, Cs compounds, Ba compounds, Ca compounds and the like can be used in place of LiF.

<Coating Liquid>

The coating liquid is obtained by dissolving a host and a dopant in an appropriate solvent. The solvent used herein may be, for example, aromatic hydrocarbon solvents such as toluene and anisole, ether solvents such as tetrahydrofuran, alcohols, fluorine solvents, as long as the respective materials are dissolved in the solvent. In addition, mixed solvents may be adopted which have more than one of the previously mentioned solvents mixed for the adjustment of the solubility and drying rate for each material.

Application methods for depositing the light-emitting layer 203 can include a spin coat method, a cast method, a dip coat method, a spray coat method, a screen printing method, an ink-jet printing method, a reverse printing method, and a slot die coat method. One of these methods is used to form the light-emitting layer 203.

Example 7

FIG. 3 is a cross-sectional view of an organic white light-emitting element according to Example 7. The following materials were used for the respective layers. A glass substrate was used for the substrate 101, and a laminated film of Ag and ITO was used for the lower electrode 102. PEDOT (poly(3,4-ethylenedioxythiophene)):PSS (polystyrene sulfonate) was used for the hole injecting layer 201. A triphenylamine polymer was used for the hole transporting layer 202.

The carbazole derivative represented by the following chemical formula (14) was used for the host of the light-emitting layer 203.

[Chemical Formula 21]

Chemical Formula (14)

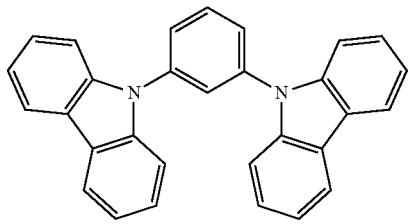

In addition, the Ir complex represented by the following chemical formula (15) was used for the red dopant.

[Chemical Formula 22]

Chemical Formula (15)

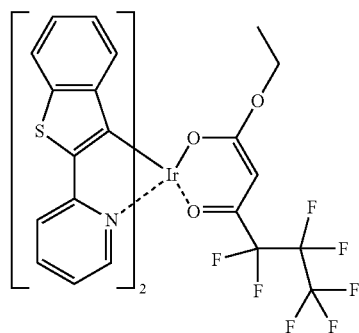

In addition, the Ir complex represented by the following chemical formula (16) was used for the blue dopant.

[Chemical Formula 23]

Chemical Formula (16)

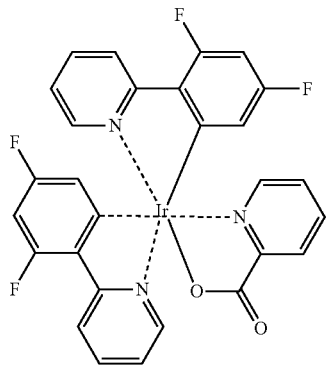

In addition, the Ir complex represented by the following chemical formula (17) was used for the green dopant.

[Chemical Formula 24]

Chemical Formula (17)

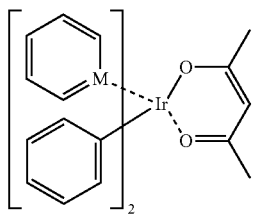

The coating liquid for the light-emitting layer is obtained by dissolving, in an appropriate solvent, the host material, the red dopant, the green dopant, and the blue dopant. In the present example, the molar concentrations of the host material, the red dopant, the green dopant, and the blue dopant in the solid content are 0.5% for the red dopant, 1.0% for the green dopant, and 5.8% for the blue dopant. Toluene was used for the solvent.

For the electron transporting layer 208, stacked structures of the following chemical formulas (18) and (19) were used.

[Chemical Formula 25]

Chemical Formula (18)

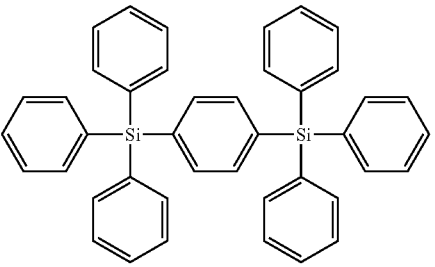

[Chemical Formula 26]

Chemical Formula (19)

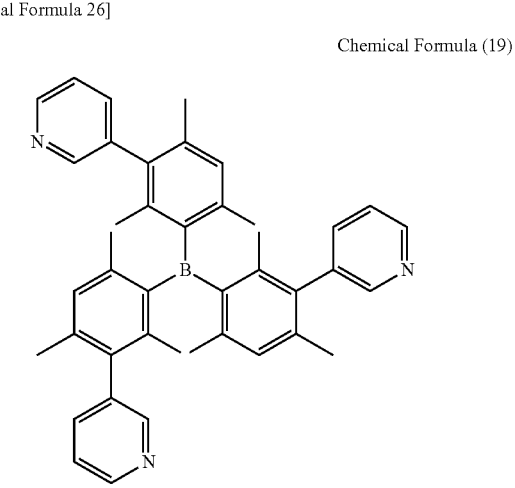

MgAg was used for the electron injecting layer 209. In addition, an IZO was used for the upper electrode.

When + potential and − potential were applied respectively to the lower electrode and upper electrode according to the present example, a white light emission was obtained which was composed of three colors of red, blue, and green. In addition, the current efficiency at the luminance of 100 cd/m$^2$ was measured. Furthermore, when the concentration distribution of the red dopant in the light-emitting layer 3 was measured by oblique cutting and TOF-SIMS, it was confirmed that the red dopant concentration at the upper surface of the light-emitting layer was five or more times as high as compared with in a central portion of the light-emitting layer.

FIG. 1 is a cross-sectional view of a light source device with the use of the organic white light-emitting element according to the present example.

The organic light-emitting element was sealed by the attachment to the sealing substrate 117 with the use of an epoxy resin for the resin layer 116. The light extraction layer 118 for scattering was provided on the opposite side of the sealing substrate. When + potential and − potential were applied respectively to the lower electrode and the upper electrode, a light source device for emitting light in white was obtained.

A light-emitting element prepared in the same way as in Example 7 except that the following chemical formula (20) was used as the red dopant produces a white light emission composed of three colors of red, green, and blue. In addition, the current efficiency at the luminance of 100 cd/m² was measured. The current efficiency in the comparative example was 0.7 with respect to the current efficiency of 1 in Example 7.

[Chemical Formula 27]

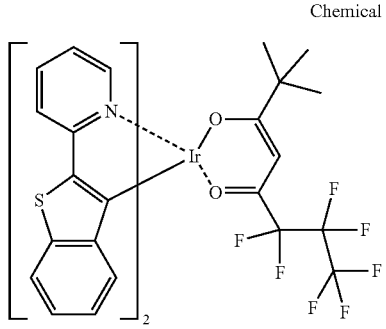

Chemical Formula (20)

Example 8

An organic light-emitting element was prepared in the same way as in Example 7, except that the following chemical formula (21) was used as the red dopant. As a result, a white light emission was obtained which was composed of three colors of red, green, and blue. The current efficiency at the luminance of 100 cd/m² was 0.9 with respect to the current efficiency of 1 in Example 7, thereby providing a higher-efficiency light emission as compared with Comparative Example 2.

[Chemical Formula 28]

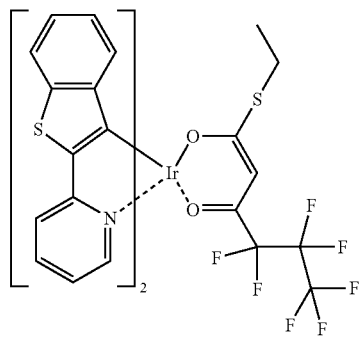

Chemical Formula (21)

Example 9

An organic light-emitting element was prepared in the same way as in Example 7, except that the following chemical formula (22) and the following chemical formula (23) were used respectively as the green dopant and the red dopant. As a result, a white light emission was obtained which was composed of three colors of red, green, and blue.

[Chemical Formula 29]

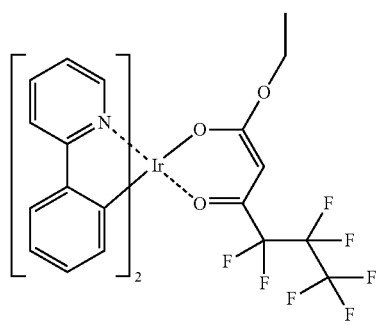

Chemical Formula (22)

[Chemical Formula 30]

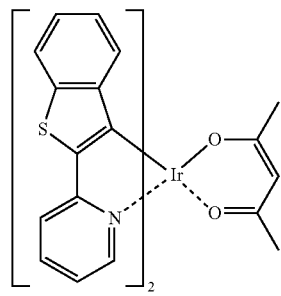

Chemical Formula (23)

In addition, the current efficiency at the luminance of 100 cd/m² was measured.

An organic light-emitting element was prepared in the same way as in Example 9, except that the following chemical formula (24) was used as the green dopant. As a result, a white light emission was obtained which was composed of three colors of red, green, and blue.

[Chemical Formula 31]

Chemical Formula (24)

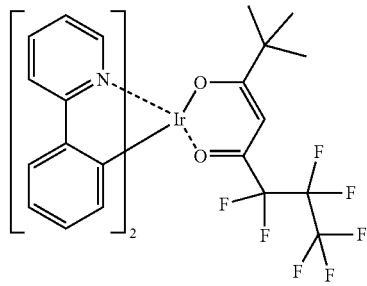

The measurement of the current efficiency at the luminance of 100 cd/m² resulted in 0.5 with respect to the current efficiency of 1 in Example 9.

Example 10

An organic light-emitting element was prepared in the same way as in Example 9, except that the following chemical formula (25) was used as the green dopant. As a result, a white light emission was obtained which was composed of three colors of red, green, and blue.

[Chemical Formula 32]

Chemical Formula (25)

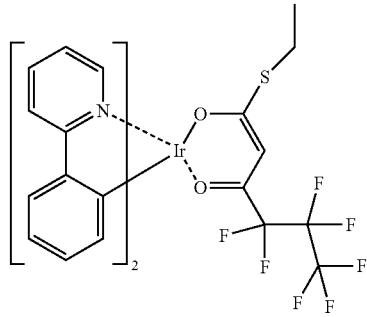

The measurement of the current efficiency at the luminance of 100 cd/m² resulted in 0.9 with respect to the current efficiency of 1 in Example 9.

Example 11

An organic light-emitting element was prepared in the same way as in Example 7, except that the following chemical formula (26) was used as the red dopant. As a result, a white light emission was obtained which was composed of three colors of red, green, and blue.

[Chemical Formula 33]

Chemical Formula (26)

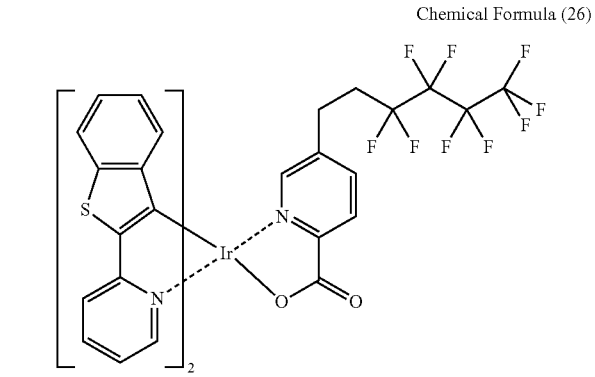

The measurement of the current efficiency at the luminance of 100 cd/m² resulted in 0.9 with respect to the current efficiency of 1 in Example 7.

Example 12

An organic light-emitting element was prepared in the same way as in Example 7, except that the following chemical formula (27) was used as the red dopant. As a result, a white light emission was obtained which was composed of three colors of red, green, and blue.

[Chemical Formula 34]

Chemical Formula (27)

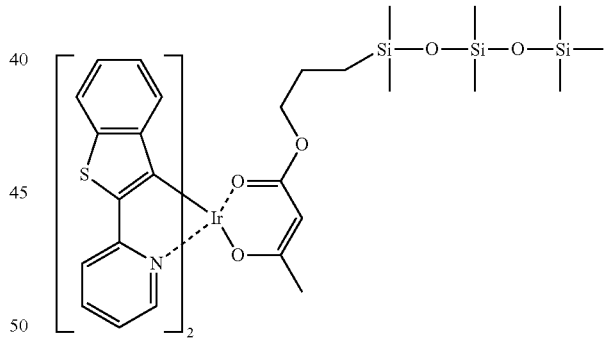

The measurement of the current efficiency at the luminance of 100 cd/m² resulted in 0.9 with respect to the current efficiency of 1 in Example 7.

Example 13

An organic light-emitting element was prepared in the same way as in Example 7, except that the following chemical formula (28) was used as the red dopant. As a result, a white light emission was obtained which was composed of three colors of red, green, and blue.

[Chemical Formula 35]

Chemical Formula (28)

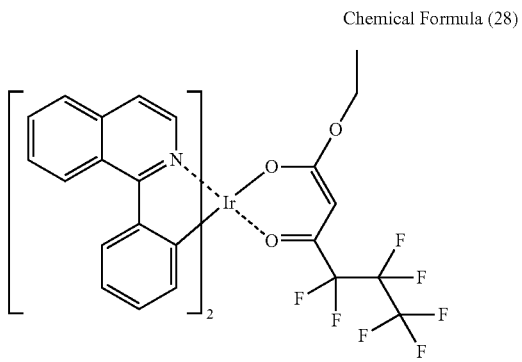

The measurement of the current efficiency at the luminance of 100 cd/m² resulted in 1.0 with respect to the current efficiency of 1 in Example 7.

Example 14

An organic light-emitting element was prepared in the same way as in Example 9, except that the following chemical formula (29) and the chemical formula (16) mentioned above were used respectively as the blue dopant and the green dopant. As a result, a white light emission was obtained which was composed of three colors of red, green, and blue.

[Chemical Formula 36]

Chemical Formula (29)

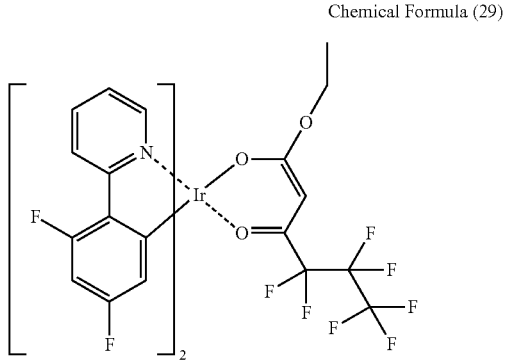

In addition, the current efficiency at the luminance of 100 cd/m² was measured.

An organic light-emitting element was prepared in the same way as in Example 14, except that the following chemical formula (30) was used as the blue dopant. As a result, no blue light emission was found, or no white light emission was obtained.

[Chemical Formula 37]

Chemical Formula (30)

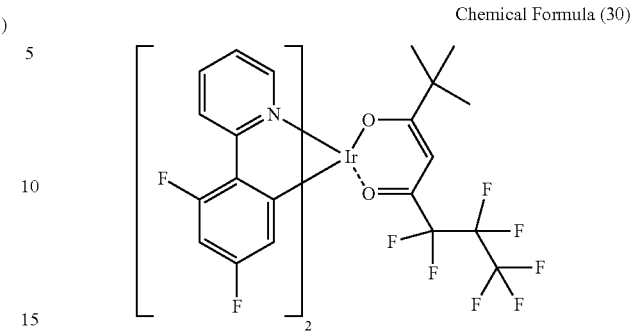

In addition, the result of measuring the current efficiency at the luminance of 100 cd/m² was 0.7 with respect to the current efficiency of 1 in Example 14.

Example 15

An organic light-emitting element was prepared in the same way as in Example 7, except that the following chemical formula (31) was used as the blue dopant. As a result, a white light emission was obtained which was composed of three colors of red, green, and blue.

[Chemical Formula 38]

Chemical Formula (31)

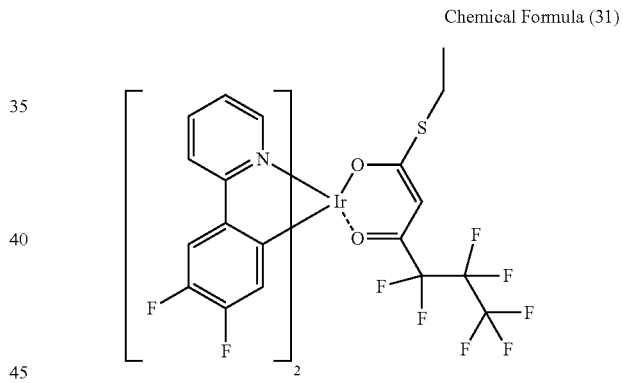

In addition, the measurement of the current efficiency at the luminance of 100 cd/m² resulted in 0.9 with respect to the current efficiency of 1.0 in Example 15.

Example 16

An organic light-emitting element was prepared in the same way as in Example 7, except that the light-emitting layer was formed with the use of a printing method by adding each of polycarbonate, polystyrene, acrylic resin, polyamide, and gelatin to the light-emitting layer 3 at 10% with respect to the solid content in Example 7. As a result, a homogeneous light-emitting layer was obtained, and a white light emission was obtained which was composed of three colors of red, green, and blue.

An organic light-emitting element was prepared in the same way as in Example 7, except that the chemical formula (23) mentioned above was used for the red dopant. As a result, only a reddish light emission with a weak blue light emission and a strong red light emission was obtained as compared with Example 7. When the concentration distribution of the red dopant in the light-emitting layer 3 was measured, almost no difference was found between in a central portion and at the upper interface of the light-emitting layer.

Example 17

An organic light-emitting element was prepared in the same way as in Example 7, except that the following chemical formula (32) and the following chemical formula (33) were used respectively as the hole transporting layer and the green dopant. As a result, a white light emission was obtained which was composed of three colors of red, green, and blue.

[Chemical Formula 39]

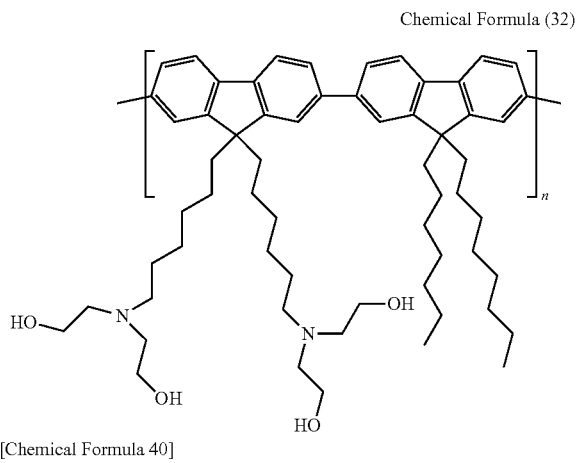

Chemical Formula (32)

[Chemical Formula 40]

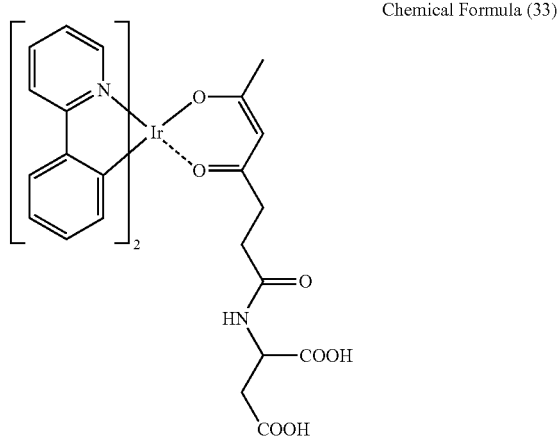

Chemical Formula (33)

In high-efficiency organic light-emitting elements with the use of conventional blue phosphorescent materials, electron blocking layers and hole blocking layers which are high in lowest triplet excitation energy (T1) have been used in order to inhibit energy transfer from the blue dopants.

Figure 4:
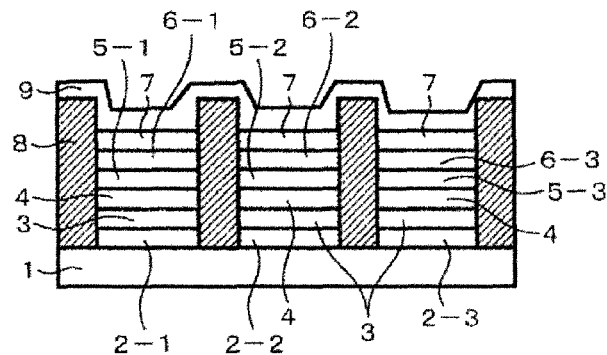
FIG. 4 is a cross-sectional view of a light source device according to Example 18 of the present invention.

FIG. 4 is a cross-sectional view in an embodiment of a light source device according to the present invention.

The substrate 1 is a glass substrate. However, the substrate 1 is not to be considered limited to the glass substrate, and plastic substrates and metal substrates can be also used which are covered with an appropriate protective film for reducing water permeability.

The lower electrode 2 is an anode. A transparent electrode is used therefor such as an ITO and IZO. However, the lower electrode 2 is not to be considered limited to those transparent electrodes, and laminated bodies of Al, Ag and the like, and combinations of Mo, Cr, or transparent electrodes with a light diffusion layer can be also used. In addition, the lower electrode is not to be considered limited to an anode, and may be used for a cathode. Used in that case is Al, Mo, a laminated body of Al and Li, an alloy such as AlNi, or the like. In addition, a transparent electrode may be used such as an ITO and IZO.

The upper electrode 9 is a cathode. Used therefor is a laminated body of Al and an electron injecting fluoride, oxide, or the like of an alkali metal such as LiF or $Li_2O$. Alternatively, a co-deposited product of Al and an alkali metal is also used. In addition, a stacked body can be also used which has a transparent electrode such as an ITO and an IZO and an electron injecting electrode such as MgAg and Li. However, the upper electrode is not to be considered limited to those materials, a MgAg or Ag thin film can be even used by itself. In addition, when an ITO or an IZO is formed by a sputtering method, a buffer layer may be provided in some cases in order to reduce the damage caused by the sputtering. A metal oxide such as a molybdenum oxide and a vanadium oxide is used for the buffer layer. When the lower electrode serves as a cathode as described above, the upper electrode serves as an anode. In that case, a transparent electrode is used such as an ITO and IZO. In addition, metal thin films can be used such as an Ag thin film. When a transparent electrode such as an ITO or an IZO is formed by a sputtering method, a buffer layer may be provided in some cases in order to reduce the damage caused by the sputtering. A metal oxide such as a molybdenum oxide and a vanadium oxide is used for the buffer layer.

The hole injecting layer 3 is a layer for injecting holes from the lower electrode 2. The hole injecting layer 3 may be provided as a single layer or multiple layers. As the hole injecting layer 3, conductive polymers are preferred such as PEDOT (poly(3,4-ethylenedioxythiophene)):PSS (polystyrene sulfonate). Besides, polymer materials of polypyrrole and triphenylamine series can be used. Furthermore, it is also possible to apply phthalocyanine compounds and starburst amine compounds which are often used in combination with low molecular (weight average molecular weight: 10000 or less) materials.

The hole transporting layer 4 is a layer for efficiently injecting holes from the hole injecting layer 3 into the light-emitting layer. As the hole transporting layer, fluorene, carbazole, arylamine, or the like is used by itself, or a copolymer thereof is used. Materials that have thiophene series or pyrrole series in their skeletons can be even used as copolymers. In addition, polymers can be also used which have, for their side chains, a skeleton such as fluorene, carbazole, arylamine, thiophene, and pyrrole. In addition, the layer is not to be considered limited to the polymers, and starburst amine compounds, arylamine compounds, stilbene derivatives, hydrazone derivatives, thiophene derivatives, and the like, can be also used. In addition, polymers may be used which contain the materials mentioned above. In addition, the hole transporting layer 4 is not to be considered limited to these materials, and there is no harm in using two or more of these materials in combination.

Generally, in the case of a blue phosphorescent element, there is a need to use, as a hole transporting layer material, a material that has high electron blocking performance, or that is high in so-called lowest unoccupied molecular orbital (LUMO). The material will differ from material that easily injects holes into red and green light-emitting layers. Therefore, in the blue phosphorescent element, there is a need to place, as an electron blocking layer, a material that differs from the hole transporting material used for the red and green light-emitting layers between the hole transporting layer and the light-emitting layer. However, there is no need to form such an electron blocking layer in the present invention, and the number of stacked layers can be reduced.

The bank 8 is formed in order to separate light-emitting layers of different luminescent colors. Photosensitive polyimides are preferred as the material. However, the material is not to be considered limited to the photosensitive polyimides, and acrylic resins and the like can be also used. In addition, non-photosensitive materials can be also used.

The light-emitting layers 5-1, 5-2, and 5-3 are layers for achieving light emissions of desired luminescent colors. The light-emitting layers 5-1, 5-2, and 5-3 contain hosts 11-1, 11-2, and 11-3 and dopants 12-1, 12-2, and 12-3. Fluorescent compounds and phosphorescent compounds can be used as the dopants. However, in the case of obtaining high-efficiency light emission, phosphorescent dopants are desirably used. The materials for forming the light-emitting layers 5-1, 5-2, and 5-3 are composed of the hosts 11-1, 11-2, and 11-3, and the red dopant 12-1, green dopant 12-2, and blue dopant 12-3. However, the red light-emitting layer and the green light-emitting layer may be mixed to provide a red-green light-emitting layer. In that case, the red-green light-emitting layer includes a host, and the red dopant 12-1 and the green dopant 12-2. The light-emitting layers 5-1, 5-2, and 5-3 may contain an electron transporting material (a hole transporting material or an electron transporting material) besides the host and dopants. Those materials are used for improving the charge balance in the light-emitting layers. In addition, the light-emitting layers may contain binder polymers.

The dopant 12-3 is provided with an appropriate functional group, and the dopant 12-3 is localized at the surface of the light-emitting layer 5-3 with the charge transporting layer present thereon. Alternatively, the electron transporting material may be provided with the functional group. A case of providing the charge transporting material with the functional group will be described below.

For example, when the dopant 12-3 and the charge transporting material are each provided with an alkyl group having four or more carbon atoms for the functional group provided in the dopant 12-3 and the functional group provided in the charge transporting material, the interaction between alkyl chains localizes the dopant 12-3 near the charge transport layer. In this case, the functional group of the dopant 12-3 and the functional group of the charge transporting material attract the dopant 12-3 in the light-emitting layer to the surface of the light-emitting layer with the charge transporting layer present thereon. Therefore, a single application can form a pseudo stacked structure.

In this case, the dopant 12-3 forms a concentration distribution in the light-emitting layer, where the peak position of the concentration of the dopant 12-3 is closer to the charge transporting layer from the center of the light-emitting layer in the film thickness direction of the light-emitting layer. In addition, the concentration of the dopant 12-3 monotonically decreases from the peak position of the concentration of the dopant 12-3 toward the surface of the light-emitting layer without the charge transporting layer for the formation of the light-emitting layer in the film thickness direction of the light-emitting layer. In the case of using the interaction between the dopant 12-3 and the charge transporting material, a hydroxy group or a carboxyl group may be used as the functional group of the dopant 12-3 and the functional group of the charge transporting material.

In addition, substituents that can form a hydrogen bond are provided for the functional group of the dopant 12-3 and the functional group of the charge transporting material to strengthen the interaction between the dopant 12-3 and the charge transporting material, and localize the dopant 12-3 near the charge transporting layer. The conceivable substituents which can form a hydrogen bond include, but not limited to, the following compositions. The substituents which can form a hydrogen bond may be at least one of the following compositions, or may exist two or more thereof. It is desirable to select only one of the following compositions as the substituents which can form a hydrogen bond. This can inhibit hydrogen bonds between the dopants 12-3.

(1) the functional group of the dopant 12-3 is a hydroxy group, whereas the functional group of the charge transporting material is a carboxyl group (2) the functional group of the dopant 12-3 is a carboxyl group, whereas the functional group of the charge transporting material is a hydroxy group (3) the functional group of the dopant 12-3 is an amide group, whereas the functional group of the charge transporting material is an acyl group (4) the functional group of the dopant 12-3 is an acyl group, whereas the functional group of the charge transporting material is an amide group.

(5) the functional group of the dopant 12-3 is an amino group, whereas the functional group of the charge transporting material is a hydroxy group Examples of the acyl group include a carboxyl group, alkanoyl groups such as an acetyl group, a benzoyl group, a sulfonyl group, and a phosphonoyl group. The functional groups mentioned above may be directly provided on the main skeleton of the dopant 12-3 or the charge transporting layer, or may be provided with an amide linkage or an ester linkage interposed.

In addition, the perfluorophenyl group for the functional group of the dopant 12-3 and the phenyl group for the functional group of the charge transporting layer form a strong intermolecular attractive force comparable to a hydrogen bond. To summarize the foregoing, the following compositions are conceivable as the functional group of the dopant 12-3 and the functional group of the charge transporting material. In this case, at least one of the following compositions may be present, or two or more thereof may be present.

(1) The functional group of the dopant 12-3 and the functional group of the charge transporting material are alkyl groups having four or more carbon atoms.

(2) The functional group of the dopant 12-3 and the functional group of the charge transporting material form a hydrogen bond.

(3) The functional group of the dopant 12-3 is a perfluorophenyl group, and the functional group of the charge transporting material is a phenyl group.

The dopant 12-3 contained in the light-emitting layer 5-3 may be entirely provided with the functional group, or the dopant 12-3 may be partially provided with the substituent. In addition, the charge transporting material contained in the charge transporting layer may be entirely provided with the functional group, or the charge transporting material may be partially provided with the functional group.

It is preferable to use, as the host 11, a triphenylamine derivative, a carbazole derivative, a fluorene derivative, or an arylsilane derivative. In addition, metal complexes of 8-quinolinol and the like can be also used. In addition, binder polymers can be also used in combination, such as polycarbonate, polystyrene, acrylic resins, polyamide, and gelatin. In order to achieve efficient light emissions, the excitation energy of the host 11 is preferably adequately higher than the excitation energy of the dopant 12. Therefore, typically, the bandgap (energy difference between highest occupied molecular orbital (HOMO) and lowest unoccupied molecular orbital (LUMO)) of the host becomes larger than the bandgap of the luminescent dopant. Typically, the blue, green, and red dopants meet blue>green>red in terms of bandgap, and the hosts also meet host for blue>host for green>host for red in terms of bandgap. The host material which is wider in bandgap typically has deep HOMO energy and shallow LUMO energy. Accordingly, the host for blue typically has the deepest HOMO energy. It is to be noted that the excitation energy is measured with the use of the emission spectrum.

An Ir complex is used for the red dopant. In addition, various types of metal complexes of Pd, Pt, Al, Zn, and the like, and organic materials such as DCM ([2-[(E)-4-(dimethylamino)styryl]-6-methyl-4H-pyran-4-ylidene]malononitrile) and triazine derivatives can be also used.

An Ir complex is used for the green dopant. In addition, various types of metal complexes of Pd, Pt, Al, Zn, and the like, and organic materials such as coumarin dyes, quinacridone, and triazine derivatives can be also used.

An Ir complex is used for the blue dopant. In addition, various types of metal complexes of Pd, Pt, Al, and the like, and organic materials such as styrylamine series and triazine derivatives can be also used.

The hole blocking layers 6-1, 6-2, and 6-3 are layers for preventing holes from moving from the light-emitting layer to the electron transporting layer. In addition, the hole blocking layers also have the role of preventing the excitation energy of the luminescent dopant from being transferred to the hole blocking layer or the electron transporting layer. For example, bis(2-methyl-8-quinolinolato)-4-(phenylphenolato) aluminum (hereinafter, BAlq), tris(8-quinolinolato) aluminum (hereinafter, Alq3), Tris(2,4,6-trimethyl-3-(pyridin-3-yl)phenyl)borane (hereinafter, 3TPYMB), 1,4-Bis(triphenylsilyl)benzene (hereinafter, UGH2), oxadiazole derivatives, triazole derivatives, fullerene derivatives, phenanthroline derivatives, quinoline derivatives, benzimidazole derivatives and the like can be used as a material for the hole blocking layer. There is a need to use a material, in particular, with deep highest occupied molecular orbital (HOMO) energy for the layer for use as the hole blocking layer of the blue phosphorescent light-emitting layer. The hole blocking layer needs to have sufficiently deeper HOMO energy than the HOMO energy of the light-emitting layer, in order to block the hole injection from the light-emitting layer to the electron transporting layer. In addition, in order to prevent the excitation energy of the luminescent dopant from being transferred, the excitation energy of the hole blocking layer needs to be sufficiently higher than that of the luminescent dopant. To that end, the layer typically needs to have sufficiently shallower LUMO energy and deeper HOMO energy than those of the luminescent dopant. As described previously, the host and dopants are deeper in terms of HOMO energy in the order of blue, green, and red. Accordingly, the hole blocking layer for blue needs to have the deepest HOMO energy. In addition, from the perspective of energy control, the layer typically has the shallowest LUMO energy. From the perspective of hole blocking performance, the material of the hole blocking layer for blue can be used for green and red. However, the hole blocking layer with deeper HOMO energy and shallower LUMO energy has the problem of decreased stability and electron transporting performance. Therefore, it is desirable to select separate hole blocking layers for blue, green, and red from the perspective of improvements in performance and stability for all of the luminescent colors.

The electron transporting layer 7 is a layer for transporting electrons through the hole blocking layer to the light-emitting layer. For example, bis(2-methyl-8-quinolinolato)-4-(phenylphenolato) aluminum (hereinafter, BAlq), tris(8-quinolinolato) aluminum (hereinafter, Alq3), Tris(2,4,6-trimethyl-3-(pyridin-3-yl)phenyl)borane (hereinafter, 3TPYMB), 1,4-Bis(triphenylsilyl)benzene (hereinafter, UGH2), oxadiazole derivatives, triazole derivatives, fullerene derivatives, phenanthroline derivatives, quinoline derivatives, benzimidazole derivatives and the like can be used as a material for the electron transporting layer.

Figure 5:
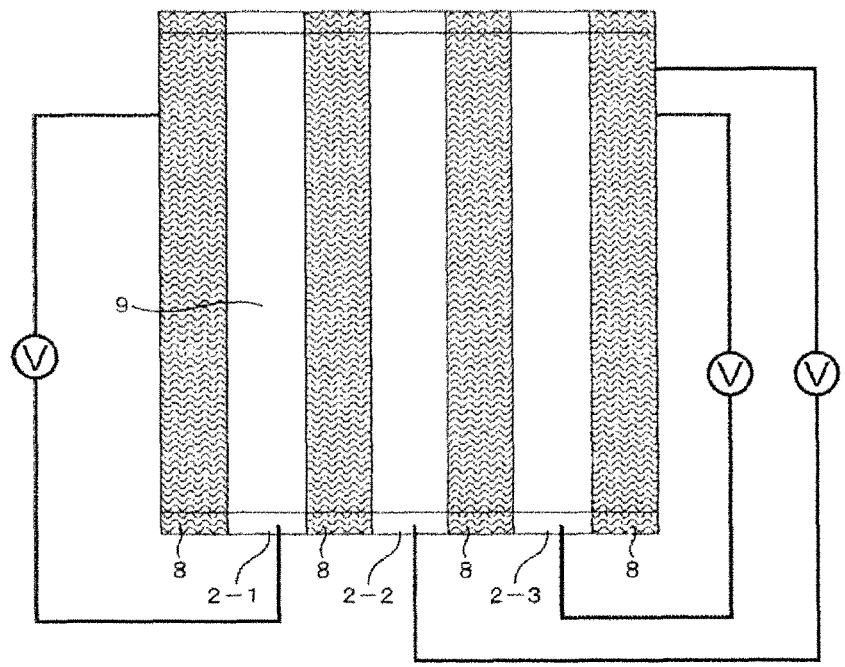
FIG. 5 is a cross-sectional view in an embodiment of an organic light-emitting element according to the present invention.

FIG. 5 is a top view of the light source device according to the embodiment of the present invention in FIG. 4. This light source device has light-emitting layers for emitting light in red, green, and blue respectively on lower electrodes 2-1, 2-2, and 2-3. Desired luminescent colors such as white can be obtained by adjusting the voltage applied between the lower electrodes 2-1, 2-2, and 2-3 and the upper electrode 9.

With reference to specific examples below, the subject matter of the invention of the present application will be described in further details. The following examples are intended to demonstrate specific examples according to the inventive subject matter of the present application, the invention of the present application is not to be considered limited to these examples, and various changes and modifications can be made by one skilled in the art within the scope of the technical idea disclosed in this specification.

Table 1 in FIG. 10 describes the list of materials for use in respective layers according to Examples 18 to 26 and Comparative Examples 6 to 9.

Example 18

FIG. 4 is a cross-sectional view of a light source device according to Example 18. The following materials were used for respective layers.

A glass substrate was used for the substrate 1, and an ITO was used for the lower electrode 2. PEDOT (poly(3,4-ethylenedioxythiophene)):PSS (polystyrene sulfonate) was used for the hole injecting layer 3. A triphenylamine polymer was used for the hole transporting layer 4.

BAlq was used for the host 11-1 of the light-emitting layer 5-1. Light-emitting layers 5-1, 5-2, and 5-3 that differ in luminescent color are formed on the substrate 1 in a direction along the principal surface.

In addition, an Ir complex represented by the following chemical formula (34) was used for the dopant 12-1 (red dopant).

[Chemical Formula 41]

Chemical Formula (34)

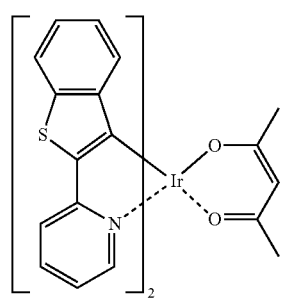

In addition, a material represented by the following chemical formula (35) was used for the host 11-2 of the light-emitting layer 5-2.

[Chemical Formula 42]

Chemical Formula (35)

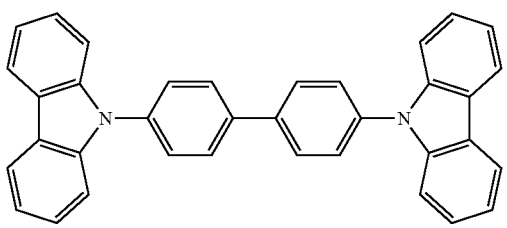

An Ir complex represented by the following chemical formula (36) was used for the dopant 12-2 (green dopant).

[Chemical Formula 43]

Chemical Formula (36)

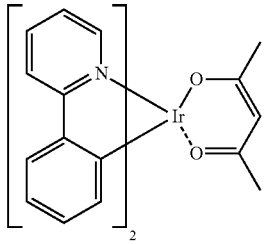

A material represented by the following chemical formula (37) was used for the host 11-3 of the light-emitting layer 5-3.

[Chemical Formula 44]

Chemical Formula (37)

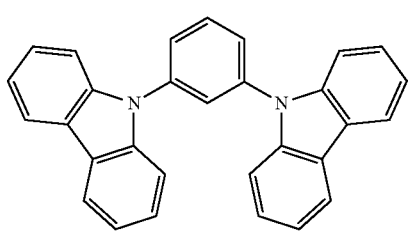

An Ir complex represented by the following chemical formula (38) was used for the dopant 12-3 (blue dopant).

[Chemical Formula 45]

Chemical Formula (38)

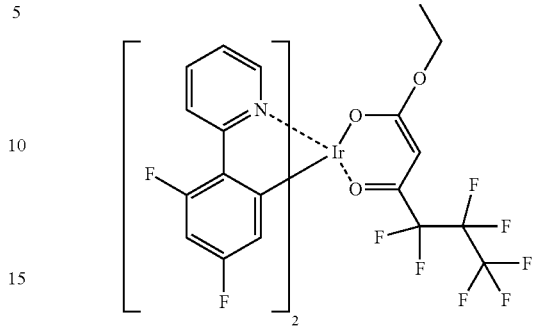

It is to be noted that the chemical formula (38) contains a fluoroalkyl group.

In the light-emitting layer 5-3, the dopant 12-3 is 1% in ratio by weight with respect to the host 11-3. The coating liquid for forming the light-emitting layer 5-3 was prepared with the use of toluene for the solvent, so that the solid content was 1% in terms of ratio by weight to the solvent. This coating liquid was used to form the light-emitting layer 5-3 by using an ink-jet method.

Balq was used for the hole blocking layer 6-1. In addition, N-arylbenzimidazoles Trimer was used for the hole blocking layer 6-2. In addition, a material represented by the following chemical formula (39) was used for the hole blocking layer 6-3.

[Chemical Formula 46]

Chemical Formula (39)

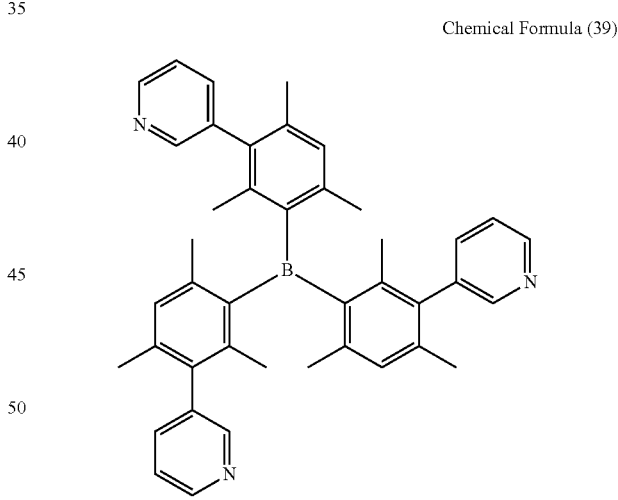

For the electron transporting layer 7, Alq3 was used.

For the upper electrode 9, a stacked structure of LiP/Al was used.

When + potential and − potential were applied respectively to the lower electrodes 2-1, 2-2, and 2-3 and upper electrode 9 according to the present example, a white light emission was obtained which was composed of three colors of red, blue, and green. In addition, the current efficiency at a luminance of 100 cd/m² was measured. Furthermore, when the concentration distribution of the dopant 12-3 (blue dopant) in the light-emitting layer 5-3 was measured by oblique cutting and TOF-SIMS, it was confirmed that the concentration at the upper surface of the light-emitting layer 5-3 was five or more times as high as compared with in a central portion of the light-emitting layer 5-3. As just described, the large amount of dopant 12-3 present at the upper surface of the light-emitting layer 5-3 improves the luminescent efficiency of the organic light-emitting element, because light is emitted without energy transfer from the dopant 12-3 to the hole transporting layer 4.

It is to be noted that the concentration of the dopant 12-3 in the light-emitting layer 5-3 is higher in a region of the light-emitting layer 5-3 with the electron transporting layer 7 and upper electrode 9 closer thereto than in a region of the light-emitting layer 5-3 with the electron transporting layer 7 and upper electrode 9 farther therefrom in Example 18. This difference in concentration is believed to be produced by the movement of the dopant 12-3 to the region of the light-emitting layer 5-3 with the electron transporting layer 7 and upper electrode 9 closer thereto.

In Comparative Example 6, a light source device was prepared in the same way as in Example 18, except that the following chemical formula (40) was used for the dopant 12-3 (blue dopant) of the light-emitting layer 5-3.

[Chemical Formula 47]

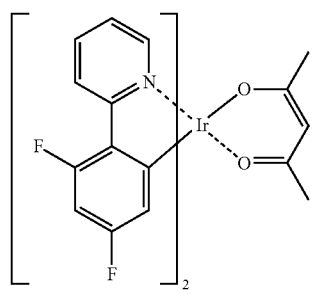

Chemical Formula (40)

As a result, the blue luminescent efficiency was lower than that in Example 18, and on the order of 0.6 with respect to the current efficiency of 1 for the blue luminescence in Example 18. This is because, due to the chemical formula (40) as the luminescent dopant distributed entirely in the light-emitting layer, the energy of the luminescent dopant in an excited state produced near the hole transporting layer 4 was transferred to the hole transporting layer to stop emitting light in blue, and thus decrease the luminescent efficiency as a whole. In the light-emitting layer 5-3 according to Example 18, the dopant 12-3 (blue dopant) is localized near the hole blocking layer, light is thus emitted without any transfer of an excited state on the dopant to the hole transporting layer 4, and the efficiency is thus never decreased.

Figure 6:
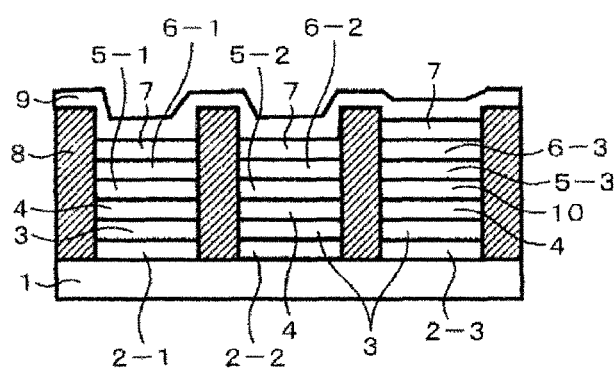
FIG. 6 is a cross-sectional view of a light source device according to Comparative Example 6.

FIG. 6 is a cross sectional view of a light source device according to Comparative Example 6. In Comparative Example 7, a light source device was prepared in the same way as in Comparative Example 6, except that an electron blocking layer 10 was placed between the hole transporting layer 4 and the light-emitting layer 5-3. 4,4'-cyclohexyliden-ebis[N,N-bis(4-methylphenyl)-benz enamine] (hereinafter, TAPC) was used for the electron blocking layer 10. As a result, the blue luminescent efficiency was improved from that in Comparative Example 6, and the current efficiency of the blue luminescence was 1.0 with respect to 1 in Example 18.

This result is believed to be because the use of TAPC resulted in electrons blocked in the electron blocking layer 10, and further in luminescence produced without any transfer of an excited state formed on the luminescent dopant 12-3 to the hole transporting layer 4, thus improving the efficiency. As just described, in Example 18, the current efficiency comparable to that in Comparative Example 7 is achieved without forming the electron blocking layer 10 as in Comparative Example 7. Therefore, the configuration according to Example 18 can reduce the number of film formation steps to obtain a light source device for high-efficiency light emissions in a simpler way.

Example 19

Figure 7:
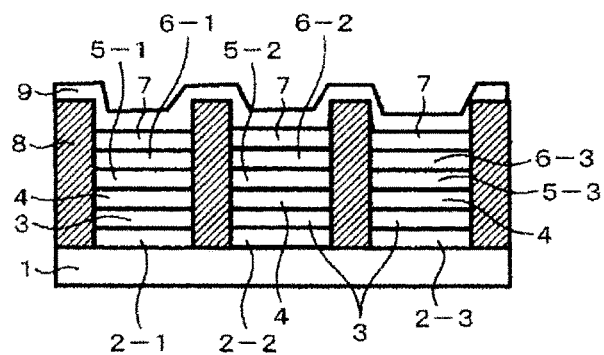
FIG. 7 is a cross-sectional view of a light source device according to Example 19 in the present invention.

A cross sectional view of a light source device according to Example 19 is shown in FIG. 7. In Example 19, the light source device was prepared in the same way as in Example 18, except that the following chemical formula (41) was used for the hole transporting layer 4, the following chemical formula (42) was used for the dopant 12-3, and the same material as that of the hole blocking layer 6-2 was used for the hole blocking layer 6-3.

[Chemical Formula 48]

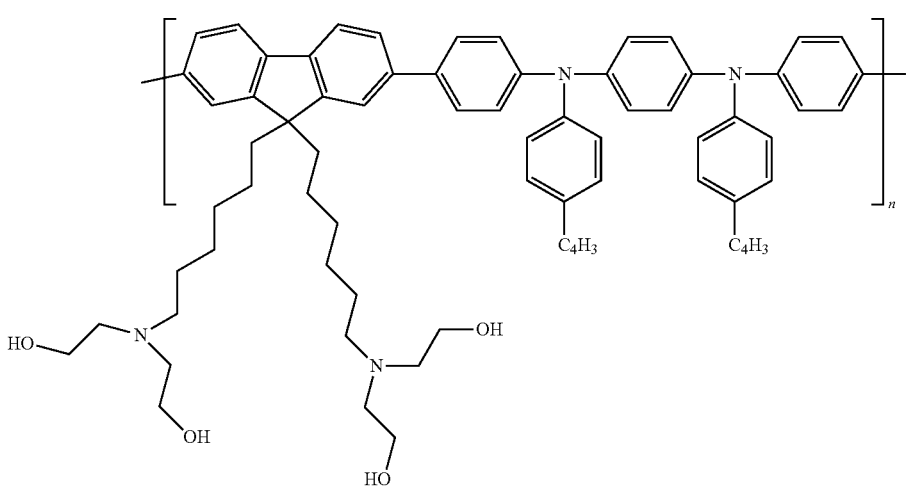

Chemical Formula (41)

[Chemical Formula 49]

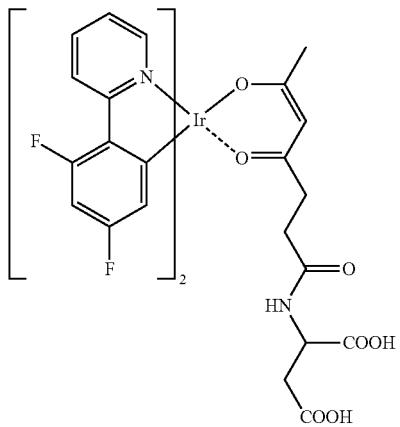

Chemical Formula (42)

When + potential and − potential were applied respectively to the lower electrodes 2-1, 2-2, and 2-3 and upper electrode 9 according to the present example, a white light emission was obtained which was composed of three colors of red, blue, and green.

The chemical formula (41) as a material for the hole transporting layer 4 according to the present example has OH groups, and the chemical formula (42) as the dopant 12-3 has COOH groups. Due to a hydrogen bond between the both functional groups, the dopant 12-3 forms a high concentration region near the interface between the dopant 12-3 and the hole transporting layer 4. Therefore, high-efficiency light emissions are achieved without energy transfer to the hole blocking layer 6-3.

It is to be noted that the concentration of the dopant 12-3 in the light-emitting layer 5-3 is higher in a region of the light-emitting layer 5-3 with the hole transporting layer 4 and lower electrode 2 closer thereto than in a region of the light-emitting layer 5-3 with the hole transporting layer 4 and lower electrode 2 farther therefrom in Example 19. This difference in concentration is believed to be produced by the movement of the dopant 12-3 to the region of the light-emitting layer 5-3 with the hole transporting layer 4 and lower electrode 2 closer thereto.

It is to be noted that the chemical formula (42) contains a carboxyl group.

A light source device according to Comparative Example 8 was prepared in the same way as in Example 19, except that the chemical formula (40) was used for the dopant 12-3.

As a result, the blue luminescent efficiency was lower than that in Example 19, and the current efficiency of blue luminescence was 0.7 with respect to the current efficiency of 1 in Example 19. This is because, due to the chemical formula (40) as the luminescent dopant distributed entirely in the light-emitting layer, the energy of the luminescent dopant in an excited state produced near the hole blocking layer 6 was transferred to the hole blocking layer to stop emitting light in blue, and thus decrease the luminescent efficiency as a whole.

Figure 8:
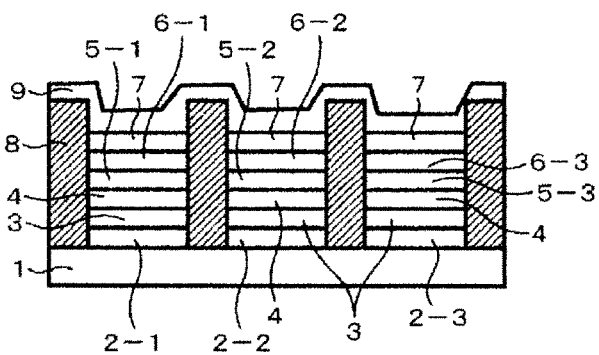
FIG. 8 is a cross-sectional view of a light source device according to Comparative Example 9.

FIG. 8 is a cross sectional view of a light source device according to Comparative Example 9. In Comparative Example 9, a light source device was prepared in the same way as in Comparative Example 8, except that the [Chemical Formula 6] was used for the hole blocking layer 6-3. As a result, the blue luminescent efficiency was improved from that in Comparative Example 6, and the current efficiency of the blue luminescence was 1.0 with respect to 1 in Example 19.

This result is believed to be because the use of the chemical formula (39) for the hole blocking layer 6-3 resulted in holes blocked in the hole blocking layer 6-3, and further in luminescence produced without any transfer of an excited state formed on the luminescent dopant 12-3 to the hole blocking layer 6-3, thus improving the efficiency.

As just described, the use of separate materials for the hole blocking layer 6-3 and the hole blocking layer 6-2 achieves the efficiency comparable to that in Example 19. With the separate materials for the hole blocking layer 6-3 and the hole blocking layer 6-2, the hole blocking layer 6-2 and the hole blocking layer 6-3 have to be formed separately. In the case of Example 19, the hole blocking layers 6-2 and 6-3 can be formed at the same time because the hole blocking layers 6-2 and 6-3 have the same material. Accordingly, Example 19 has the advantageous effect of being able to achieve a comparative efficiency even when the number of film formation steps is reduced by one step, as compared with Comparative Example 9.

Example 20

In Example 20, a light source device was prepared in the same way as in Example 18, except that the compound of the following chemical formula (43) was used for the dopant 12-3.

[Chemical Formula 50]

Chemical Formula (43)

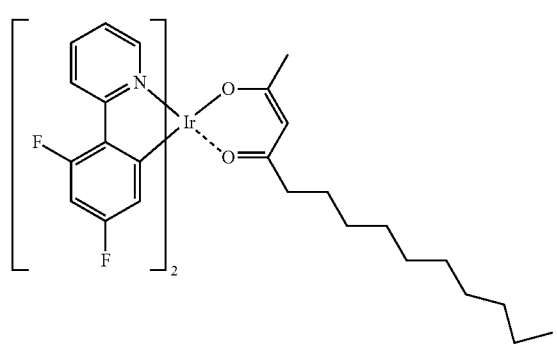

A white light emission was obtained as in Example 18, and the current efficiency of blue luminescence was 0.9 with respect to the current efficiency of 1 in Example 18.

It is to be noted that the chemical formula (43) contains an alkyl group.

Example 21

In Example 21, a light source device was prepared in the same way as in Example 18, except that the compound of the following chemical formula (44) was used for the dopant 12-3.

[Chemical Formula 51]

Chemical Formula (44)

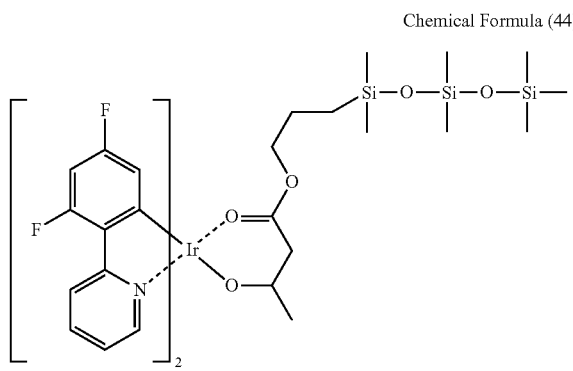

A white light emission was obtained as in Example 18, and the current efficiency of blue luminescence was 1.0 as compared with Example 18.

It is to be noted that the chemical formula 44 contains a siloxy group.

Example 22

In Example 22, a light source device was prepared in the same way as in Example 19, except that the compound of the following chemical formula (45) was used for the dopant 12-3.

Chemical Formula 52]

Chemical Formula (45)

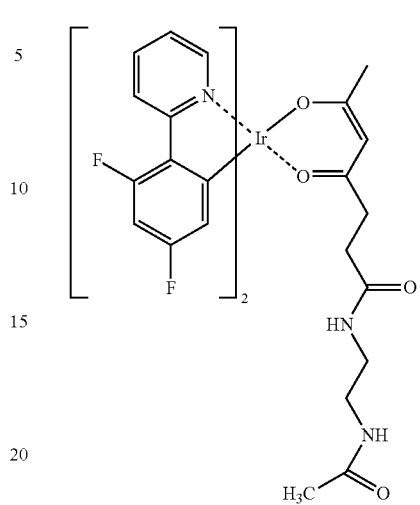

A white light emission was obtained as in Example 19, and the current efficiency of blue luminescence was 0.9 with respect to the current efficiency of 1 in Example 19.

It is to be noted that the chemical formula (45) contains an acyl group.

Example 23

In Example 23, a light source device was prepared in the same way as in Example 19, except that the compound of the following chemical formula (46) was used for the dopant 12-3.

[Chemical Formula 53]

Chemical Formula (46)

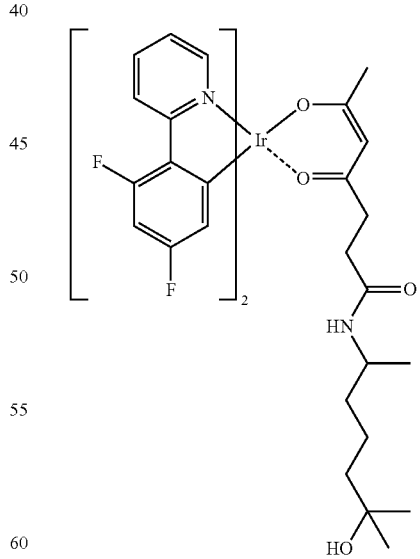

A white light emission was obtained as in Example 19, and the current efficiency of blue luminescence was 1.0 with respect to the current efficiency of 1 in Example 19.

It is to be noted that the chemical formula (46) contains an acyl group.

Example 24

In Example 24, the compound of the following chemical formula (47) was used for the hole transporting layer 4, and the compound of the following chemical formula (48) was used for the dopant 12-3. In the same way as in Example 19 except for the foregoing, a light source device was prepared.

[Chemical Formula 54]

Chemical Formula (47)

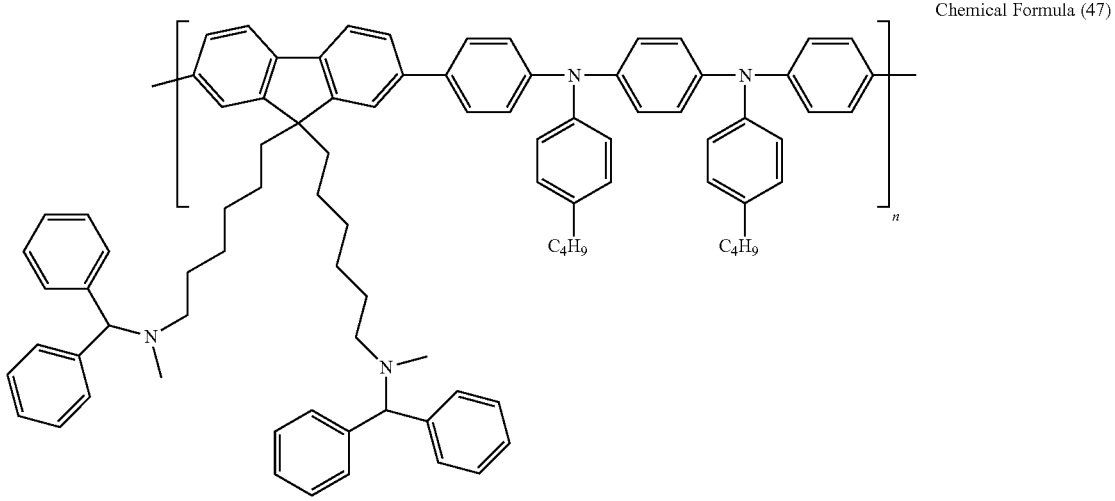

[Chemical Formula 55]

Chemical Formula (48)

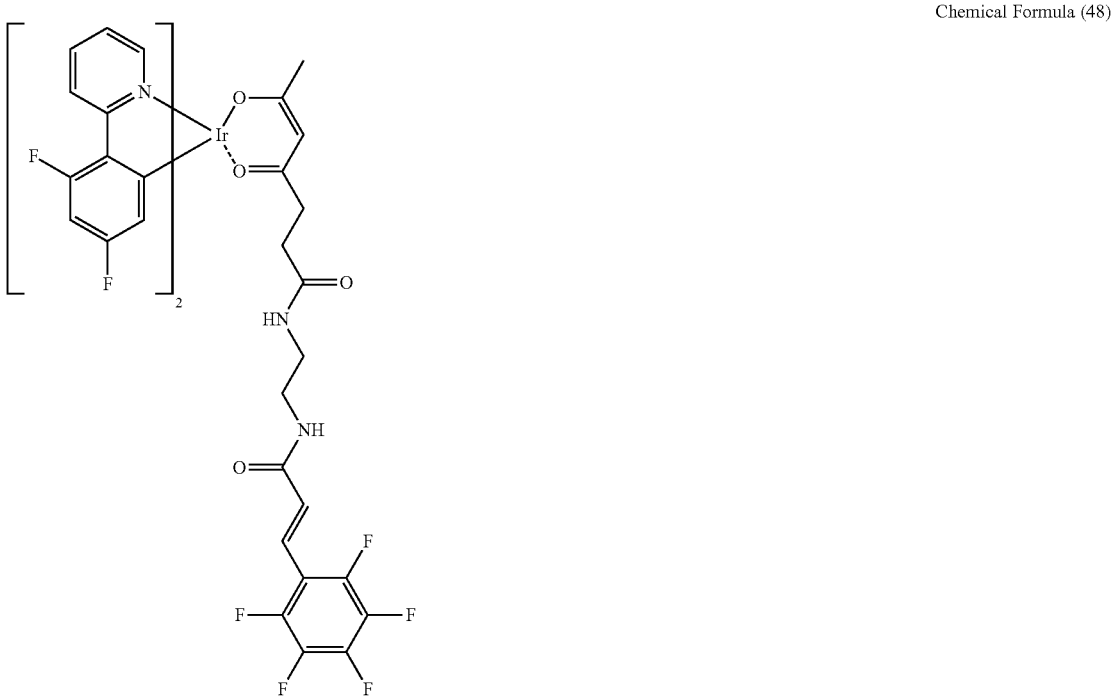

A white light emission was obtained as in Example 19, and the current efficiency of blue luminescence was also 0.9 with respect to the current efficiency of 1 in Example 19.

It is to be noted that the chemical formula (48) contains an acyl group and a perfluoro phenyl group.

Example 25

In Example 25, a light source device was prepared in the same way as in Example 18, except that the compound of the following chemical formula (49) was used for the dopant 12-3.

[Chemical Formula 56]

Chemical Formula (49)

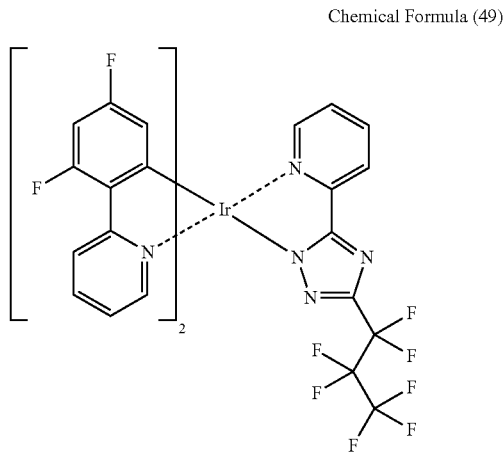

A white light emission was obtained as in Example 18, and the current efficiency of blue luminescence was 0.9 with respect to the current efficiency of 1 in Example 18.

It is to be noted that the chemical formula (49) contains a fluoroalkyl group. The chemical formula (49) is represented by the following general formula (3).

[Chemical Formula 57]

General Formula (3)

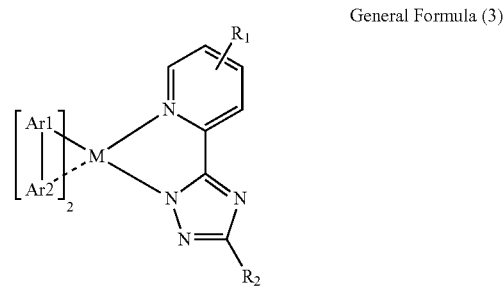

Ar1 and Ar2: an aromatic hydrocarbon or an aromatic heterocycle, M: an element in the Group 8, 9 or 10 of the periodic table, $R_1$: an alkyl group, a fluoroalkyl group, a perfluoroalkyl group, or a siloxy group, $R_2$: an alkyl group, a fluoroalkyl group, a perfluoroalkyl group, or a siloxy group, or a phenyl group, a pyridyl group, or a thiophene group which may be substituted) This general formula constitutes a material for forming an organic light-emitting element for use in an organic light-emitting element. In addition, a host and a solution are added to the material for forming an organic light-emitting element to constitute a coating liquid for forming an organic light-emitting element.

Example 26

FIG. 7 shows a cross-sectional view of a light source device according to Example 26. In Example 26, a light source device was prepared in the same way as in Example 18, except that the following chemical formula (50) was used for the dopant 12-3.

[Chemical Formula 58]

Chemical Formula (50)

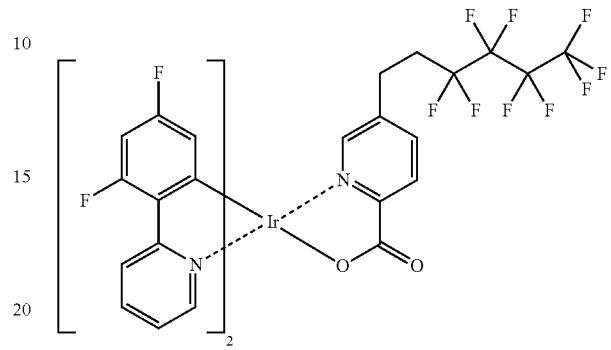

As a result, the efficiency of blue luminescence was nearly equal to that in Example 18, and on the order of 0.9 with respect to the current efficiency of 1 for the blue luminescence in Example 18.

It is to be noted that the chemical formula (50) contains a fluoroalkyl group.

In addition, the dopant 12-3 specified by Examples 18, 20, 21, 25, and 26 contains any one or more of an alkyl group, a fluoroalkyl group, and a siloxy group. In addition, the dopant 12-3 specified by Examples 19, 22, 23, and 24 contains any one or more of an acyl group, a carboxyl group, and a perfluorophenyl group.

In Example 18, the concentration of the dopant 12-3 in the light-emitting layer 5-3 is higher in a region of the light-emitting layer 5-3 with the electron transporting layer 7 and upper electrode 9 closer thereto than in a region of the light-emitting layer 5-3 with the electron transporting layer 7 and upper electrode 9 farther therefrom. Due to the dopant 12-3 containing any one or more of an alkyl group, a fluoroalkyl group, and a siloxy group, the concentration of the dopant 12-3 in the light-emitting layer 5-3 is also higher in a region of the light-emitting layer 5-3 with the electron transporting layer 7 and upper electrode 9 closer thereto than in a region of the light-emitting layer 5-3 with the electron transporting layer 7 and upper electrode 9 farther therefrom in Examples 20, 21, 25, and 26.

In Example 19, the concentration of the dopant 12-3 in the light-emitting layer 5-3 is higher in a region of the light-emitting layer 5-3 with the hole transporting layer 4 and lower electrode 2 closer thereto than in a region of the light-emitting layer 5-3 with the hole transporting layer 4 and lower electrode 2 farther therefrom. Due to the dopant 12-3 containing any one or more of an acyl group, a carboxyl group, and a perfluorophenyl group, the concentration is also higher in a region of the light-emitting layer 5-3 with the hole transporting layer 4 and lower electrode 2 closer thereto than in a region of the light-emitting layer 5-3 without the hole transporting layer 4 and lower electrode 2 farther therefrom in Examples 22, 23, and 24.

It is to be noted that the hole transporting layer 4 or the electron transporting layer 7 is one of charge transporting layers. Accordingly, the condition in Examples 18, 20, 21, 25, and 26 (the condition that the concentration of the dopant 12-3 in the light-emitting layer 5-3 is higher in a region of the light-emitting layer 5-3 with the electron transporting layer 7 and upper electrode 9 closer thereto than in a region of the light-emitting layer 5-3 without the electron transporting layer 7 and upper electrode 9 farther therefrom) and the condition in Examples 19, 22, 23, and 24 (the condition that the concentration of the dopant 12-3 in the light-emitting layer 5-3 is higher in a region of the light-emitting layer 5-3 with the hole transporting layer 4 and lower electrode 2 closer thereto than in a region of the light-emitting layer 5-3 without the hole transporting layer 4 and lower electrode 2 farther therefrom) can be collectively considered as the condition that the concentration of the dopant 12-3 in the light-emitting layer 5-3 is higher in a region of the light-emitting layer 5-3 either with the upper electrode 9 closer thereto or the lower electrode 2 closer thereto.

More specifically, in the present invention, a significant concentration difference in dopant 12-3 is produced between in a region with the upper electrode 9 closer thereto and in a region with the lower electrode 2 closer thereto. On the other hand, in the case of the light-emitting layers 5-1 and 5-2 without the functional group provided, the dopants 12-1 and 12-2 are nearly homogeneous in a region with the upper electrode 9 closer thereto and a region with the lower electrode 2 closer thereto, or the concentration differences are small therebetween, if any.

The region of the light-emitting layer 5-3 with the electron transporting layer 7 and upper electrode 9 closer thereto refers herein to a region from the center to the end in a direction toward the electron transporting layer 7 and upper electrode 9 each located. The region of the light-emitting layer 5-3 with the electron transporting layer 7 and upper electrode 9 farther therefrom refers to a region from the center to the end in a direction opposite to the direction toward the electron transporting layer 7 and upper electrode 9 each located.

In addition, the region of the light-emitting layer 5-3 with the hole transporting layer 4 and lower electrode 2 closer thereto refers to a region from the center to the end in a direction toward the hole transporting layer 4 and lower electrode 2 each located. In addition, the region of the light-emitting layer 5-3 with the hole transporting layer 4 and lower electrode 2 farther therefrom refers to a region from the center to the end in a direction opposite to the direction toward the hole transporting layer 4 and lower electrode 2 each located.

Example 27

Figure 9:
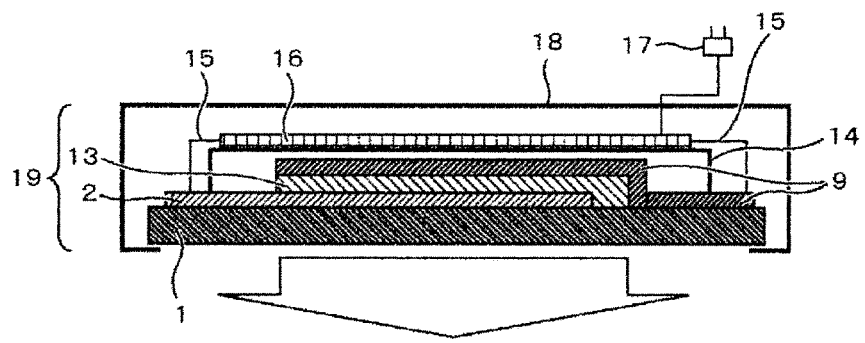
FIG. 9 is a configuration diagram of a light source device according to the present invention.

The light source device 19 shown in FIG. 9 was prepared as an example of the present invention. An organic light-emitting element as a component of the light source device 19 is composed of a substrate 1, a lower electrode 2, an organic layer 13, and an upper electrode 9 as in the case of Example 18. The organic light-emitting element is sealed with a sealing tube glass 14 with a desiccant agent so as to block the organic layer 13 from the outer air. In addition, the lower electrode 2 and the upper electrode 9 are each connected through a wiring 15 to a driving circuit 16. Further, the organic light-emitting element with the sealing tube glass 14 and the driving circuit 16 are covered with a housing 18 to serve as the light source device 19 as a whole. It is to be noted that the device is lighted up by connecting the driving circuit 16 through a plug 17 to an external power supply.

REFERENCE SIGNS LIST

1: substrate, 2: lower electrode, 3: hole injecting layer, 4: hole transporting layer, 5-1, 5-2, 5-3: light-emitting layer, 6-1, 6-2, 6-3: hole blocking layer, 7: electron transporting layer, 8: bank, 9: upper electrode, 10: electron blocking electrode, 11-1, 11-2, 11-3: host, 12-1, 12-2, 12-3: dopant, 13: organic layer, 14: sealing tube glass, 15: wiring, 16: driving circuit, 17: plug, 18: housing, 19: light source device, 114: bank, 115: inverse tapered bank, 116: resin layer, 117: sealing substrate, 118: light extraction layer, 101: substrate, 102: lower electrode, 103: hole injecting layer, 104: hole transporting layer, 105: light-emitting layer, 106: electron transporting layer, 107: electron injecting layer, 108: upper electrode, 109: organic layer, 110: OLED, 201: hole injecting layer, 202: hole transporting layer, 203: light-emitting layer, 208: electron transporting layer, 209: electron injecting layer.

The invention claimed is:

1. An organic light-emitting element comprising a first electrode, a charge transporting layer, a second electrode, and a light-emitting layer placed between the first electrode and the second electrode, wherein the first electrode, the charge transporting layer, the light-emitting layer, and the second electrode are placed in order on a surface of a substrate, the light-emitting layer comprises a host and a first dopant, and the first dopant is represented by the following chemical formula (1):

[Chemical Formula 1]

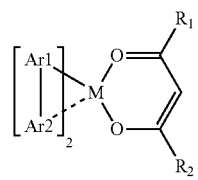

Chemical Formula (1)

wherein in the formula, Ar1 and Ar2 represent an aromatic hydrocarbon or an aromatic heterocycle, M represents an element in the Group 8, 9 or 10 of the periodic table, $R_1$ represents an alkoxy group or an alkylthio group, $R_2$ represents any one functional group selected from the group consisting of a perfluoropolyether group, an alkyl group having 10 or more carbon atoms, and a siloxy group, and the respective substituents may form bonds with the other substituents, wherein the first dopant has a concentration distribution in the light-emitting layer, and in a region of the light-emitting layer with the substrate farther therefrom than a region of the light-emitting layer closer to the substrate, a molar concentration of the first dopant is higher than an average molar concentration of the first dopant in the light-emitting layer, wherein the light-emitting layer comprises a second dopant, the charge transporting layer comprises a charge transporting material, the second dopant comprises a substituent for the second dopant, the charge transporting material comprises a substituent for the charge transporting material, and the second dopant is located between a center of the light emitting layer and at a surface of the light-emitting layer with the substrate present thereon, wherein:
(1) the substituent for the second dopant and the substituent for the charge transporting material form a hydrogen bond, and/or (2) the substituent for the second dopant is a perfluorophenyl group, and the substituent for the charge transporting material is a phenyl group,
and wherein the concentration of the first dopant monotonically decreases in the light-emitting layer in a direction towards the substrate, and a concentration of the second dopant monotonically decreases in the light-emitting layer in a direction away from the substrate.

2. The light-emitting element according to claim 1 wherein the light-emitting layer includes one or more of: polycarbonate, polystyrene, acrylic resins, polyamide, and gelatin.

3. The organic light-emitting element according to claim 1, wherein a wavelength at which a maximum intensity is shown in a photoluminescence spectrum for the second dopant is longer than a wavelength at which a maximum intensity is shown in a photoluminescence spectrum for the first dopant, and a molar concentration of the second dopant in a solid content of the light-emitting layer is higher than a molar concentration of the first dopant in the solid content of the light-emitting layer.

4. A coating liquid for forming a light-emitting layer for use in the organic light-emitting element according to claim 1, wherein the coating liquid for forming the organic light-emitting element comprises the host, the first dopant, and a solvent.

5. A material for forming a light-emitting layer for use in the organic light-emitting element according to claim 1, wherein the material for forming the organic light-emitting element comprises the host and the first dopant.

6. A light source device comprising the organic light-emitting element according to claim 1, and a driving device for driving the organic light-emitting element.

7. A method for manufacturing an organic light-emitting element comprising a first electrode, a charge transporting layer, a second electrode, and a light-emitting layer placed between the first electrode and the second electrode, comprising:
forming the first electrode, the charge transporting layer, the light-emitting layer, and the second electrode in order on a surface of a substrate; and
preparing the light-emitting layer by a process that includes coating;
wherein the light-emitting layer comprises a host and a first dopant, and the first dopant is represented by the following chemical formula (1):

[Chemical Formula 1]

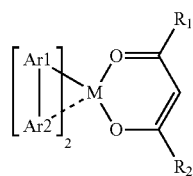

Chemical Formula (1)

wherein in the formula, Ar1 and Ar2 represent an aromatic hydrocarbon or an aromatic heterocycle, M represents an element in the Group 8, 9 or 10 of the periodic table, $R_1$ represents an alkoxy group or an alkylthio group, $R_2$ represents any one functional group selected from the group consisting of a perfluoropolyether group, an alkyl group having 10 or more carbon atoms, and a siloxy group, and the respective substituents may form bonds with the other substituents;
wherein the first dopant has a concentration distribution in the light-emitting layer, and in a region of the light-emitting layer with the substrate farther therefrom than a region of the light-emitting layer closer to the substrate, a molar concentration of the first dopant is higher than an average molar concentration of the first dopant in the light-emitting layer,
wherein the light-emitting layer comprises a second dopant, the charge transporting layer comprises a charge transporting material, the second dopant comprises a substituent for the second dopant, the charge transporting material comprises a substituent for the charge transporting material, and the second dopant is located between a center of the light emitting layer and a surface of the light-emitting layer with the substrate present thereon,
wherein the substituent for the second dopant and the substituent for the charge transporting material have any one or more of the following compositions:
(1) the substituent for the second dopant and the substituent for the charge transporting material form a hydrogen bond, and
(2) the substituent for the second dopant is a perfluorophenyl group, and the substituent for the charge transporting material is a phenyl group,
and wherein the light-emitting layer is prepared such that the concentration of the first dopant monotonically decreases in the light-emitting layer in a direction towards the substrate, and a concentration of the second dopant monotonically decreases in the light-emitting layer in a direction away from the substrate.

8. An organic light-emitting element comprising a first electrode, a second electrode, a charge transporting layer, and a light-emitting layer placed between the first electrode and the second electrode, wherein the first electrode, the charge transporting layer, the light-emitting layer, and the second electrode are placed in order on a surface of a substrate, the light-emitting layer comprises a host and a first dopant, and the first dopant is represented by the following chemical formula (1):

[Chemical Formula 1]

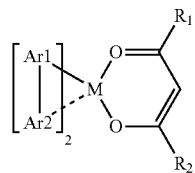

Chemical Formula (1)

wherein in the formula, Ar1 and Ar2 represent an aromatic hydrocarbon or an aromatic heterocycle, M represents an element in the Group 8, 9 or 10 of the periodic table, $R_1$ represents an alkoxy group or an alkylthio group, $R_2$ represents any one functional group selected from the group consisting of a fluoroalkyl group having three or more carbon atoms, and a perfluoroalkyl group having three or more carbon atoms, and the respective substituents may form bonds with the other substituents;
wherein the first dopant has a concentration distribution in the light-emitting layer, and in a region of the light-emitting layer with the substrate farther therefrom than a region of the light-emitting layer closer to the substrate, a molar concentration of the first dopant is higher than an average molar concentration of the first dopant in the light-emitting layer, wherein the light-emitting layer comprises a second dopant, the charge transporting layer comprises a charge transporting material, the second dopant comprises a substituent for the second dopant, the charge transporting material comprises a substituent for the charge transporting material, and the second dopant is located between a center of the light emitting layer and a surface of the light-emitting layer with the substrate present thereon, wherein the substituent for the second dopant and the substituent for the charge transporting material have any one or more of the following compositions:
  (1) the substituent for the second dopant and the substituent for the charge transporting material form a hydrogen bond, and
  (2) the substituent for the second dopant is a perfluorophenyl group, and the substituent for the charge transporting material is a phenyl group, and wherein the concentration of the first dopant monotonically decreases in the light-emitting layer in a direction towards the substrate, and a concentration of the second dopant monotonically decreases in the light-emitting layer in a direction away from the substrate.

* * * * *